(12) United States Patent  
Yoshikawa

(10) Patent No.: US 8,334,565 B2  
(45) Date of Patent: Dec. 18, 2012

(54) TRENCH TYPE INSULATED GATE MOS SEMICONDUCTOR DEVICE

(75) Inventor: Koh Yoshikawa, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 722 days.

(21) Appl. No.: 12/171,041

(22) Filed: Jul. 10, 2008

(65) Prior Publication Data

US 2009/0014754 A1    Jan. 15, 2009

(30) Foreign Application Priority Data

Jul. 10, 2007    (JP) ................................ 2007-181025  
Oct. 29, 2007    (JP) ................................ 2007-279761

(51) Int. Cl.  
    *H01L 29/94*      (2006.01)  
(52) U.S. Cl. .................. 257/330; 257/E29.198  
(58) Field of Classification Search .......... 257/327–332, 257/E29.198, 139, E21.499, E21.513, E21.514, 257/E21.705, E21.512, E29.197  
See application file for complete search history.

(56) References Cited

U.S. PATENT DOCUMENTS

| 6,221,721 | B1 | 4/2001 | Takahashi |
| 6,380,586 | B1 | 4/2002 | Yoshikawa |
| 6,737,705 | B2 | 5/2004 | Momota et al. |
| 2008/0217649 | A1 * | 9/2008 | Arai et al. .................. 257/139 |

FOREIGN PATENT DOCUMENTS

| JP | 8-316479 A | 11/1996 |
| JP | 2000-228519 A | 8/2000 |
| JP | 2001-308327 A | 11/2001 |
| JP | 2001-332728 A | 11/2001 |
| JP | 2002-314083 A | 10/2002 |
| JP | 2004-39838 A | 2/2004 |
| JP | 2004-153112 A | 5/2004 |
| JP | 2006-210547 A | 8/2006 |

* cited by examiner

*Primary Examiner* — Victor A Mandala  
*Assistant Examiner* — Selim Ahmed  
(74) *Attorney, Agent, or Firm* — Rossi, Kimms & McDowell LLP

(57) ABSTRACT

A vertical and trench type insulated gate MOS semiconductor device includes a plurality of regions each being provided between adjacent ones of a plurality of the straight-line-like trenches arranged in parallel and forming a surface pattern of a plurality of straight lines. A plurality of first inter-trench surface regions are provided, each with an $n^+$-type emitter region and a $p^+$-type body region formed thereon, and the surfaces of regions are alternately arranged along the trench in the longitudinal direction thereof with an emitter electrode being in common contact with both of the surfaces of the $n^+$-type emitter region and the $p^+$-type body region. A plurality of second inter-trench surface regions are provided each of which is formed along the trench in the longitudinal direction thereof with one of the surface of the p base region and the surface of the n-type semiconductor substrate.

22 Claims, 30 Drawing Sheets

$V_{bus}$=650V, $I_C$=400A(334A/cm²), Rg=15Ω, Tj=150°C, Ls=120nH

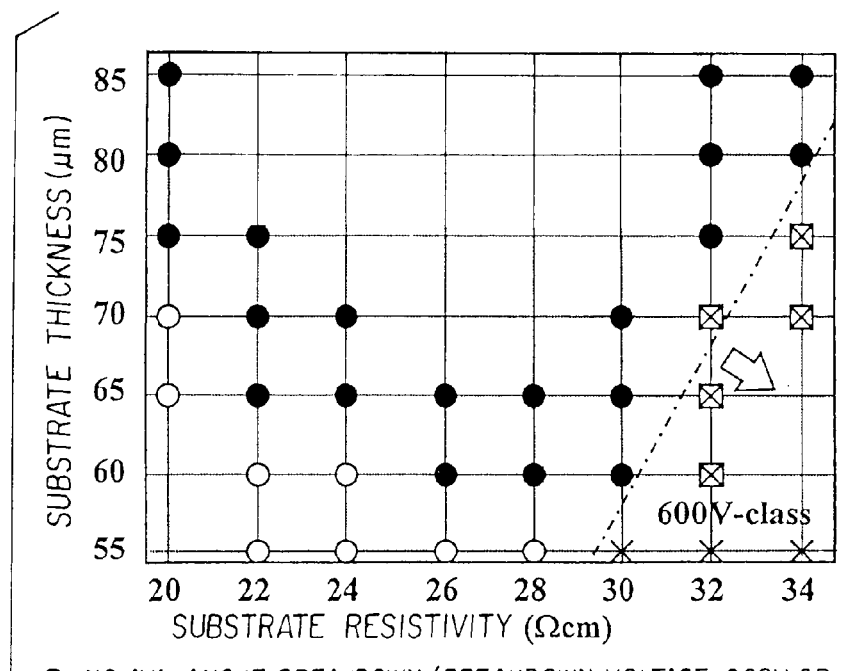

FIG. 21

- ● NO AVALANCHE BREAKDOWN (BREAKDOWN VOLTAGE 660V OR MORE)
- ○ NO AVALANCHE BREAKDOWN (BREAKDOWN VOLTAGE 660V OR LESS)
- ⊠ AVALANCHE BREAKDOWN (BREAKDOWN VOLTAGE 660V OR MORE)
- × AVALANCHE BREAKDOWN (BREAKDOWN VOLTAGE 660V OR LESS)

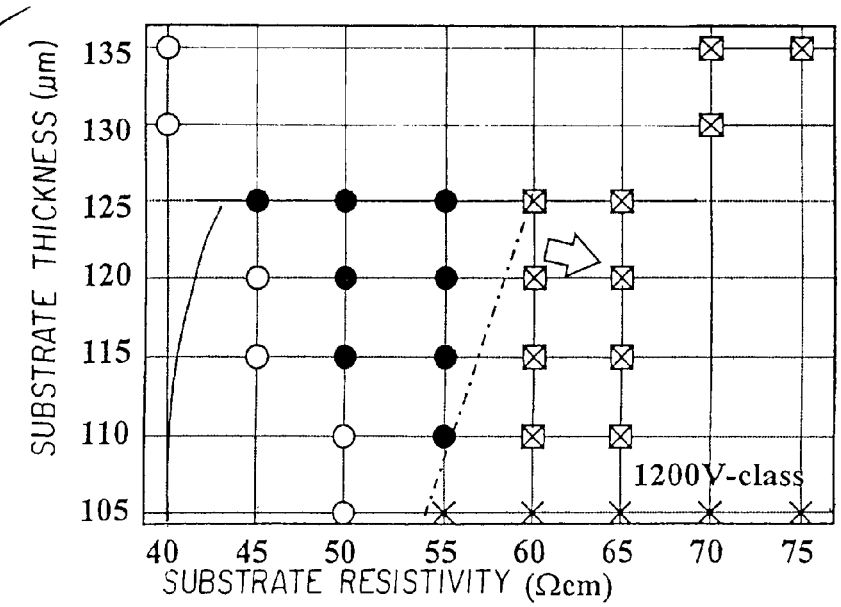

FIG. 22

- ● NO AVALANCHE BREAKDOWN (BREAKDOWN VOLTAGE 1320V OR MORE)
- ○ NO AVALANCHE BREAKDOWN (BREAKDOWN VOLTAGE 1320V OR LESS)
- ⊠ AVALANCHE BREAKDOWN (BREAKDOWN VOLTAGE 1320V OR MORE)
- × AVALANCHE BREAKDOWN (BREAKDOWN VOLTAGE 1320V OR LESS)

- ● NO AVALANCHE BREAKDOWN (BREAKDOWN VOLTAGE 3630 V OR MORE)
- ○ NO AVALANCHE BREAKDOWN (BREAKDOWN VOLTAGE 3630 V OR LESS)
- ⊠ AVALANCHE BREAKDOWN (BREAKDOWN VOLTAGE 3630 V OR MORE)
- × AVALANCHE BREAKDOWN (BREAKDOWN VOLTAGE 3630 V OR LESS)

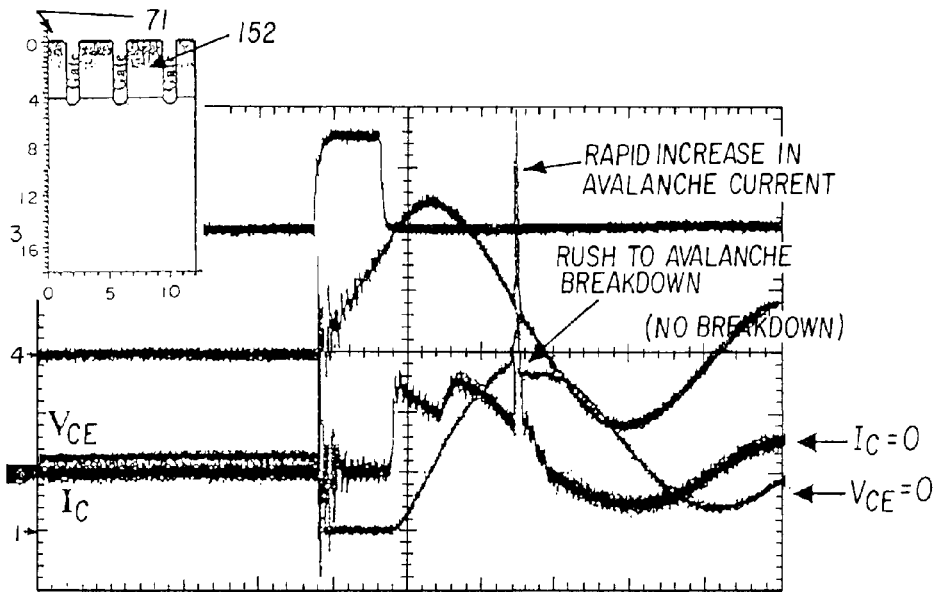
$V_{CE}$:500V/div. $I_C$:0.5A/div. *FIG. 26A*
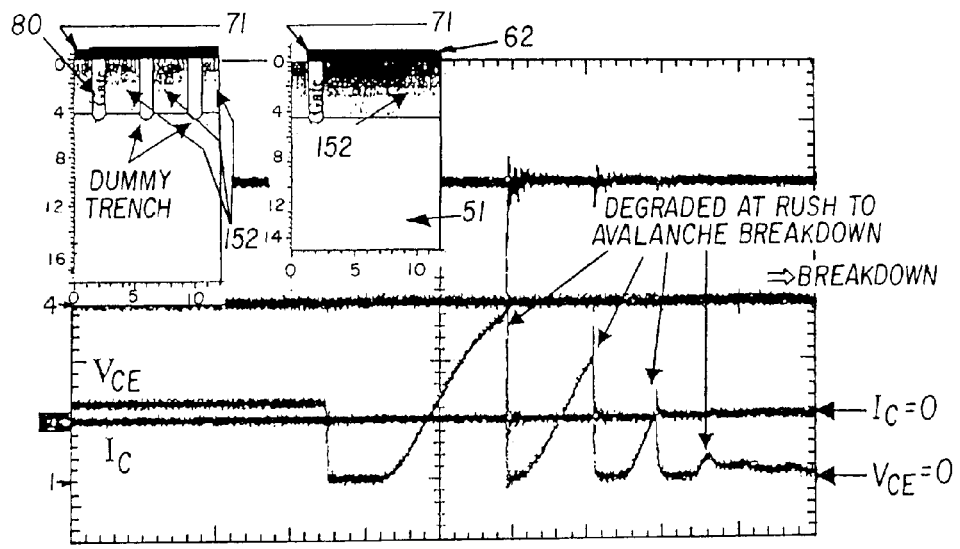
$V_{CE}$:500V/div. $I_C$:0.5A/div.
*FIG. 26B*

IMMEDIATELY BEFORE
AVALANCHE BREAKDOWN

IMMEDIATELY BEFORE
AVALANCHE BREAKDOWN

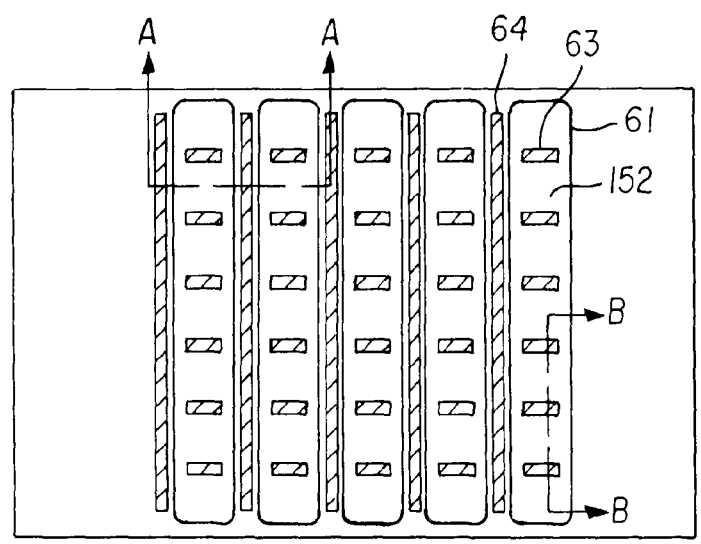
FIG. 30A
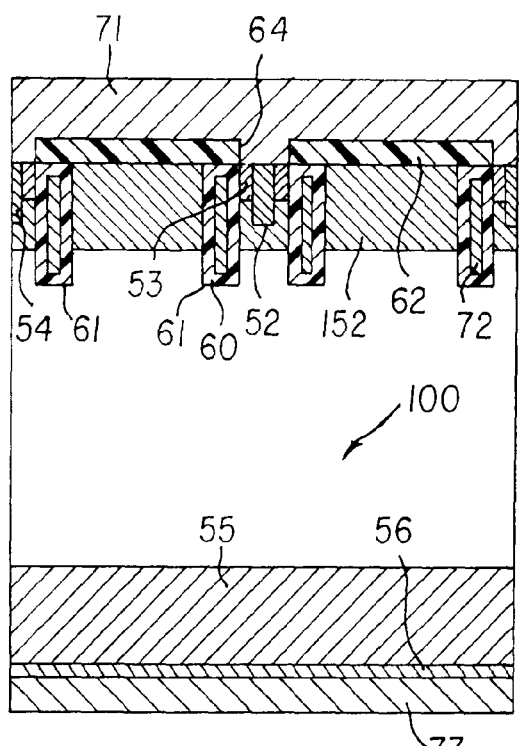 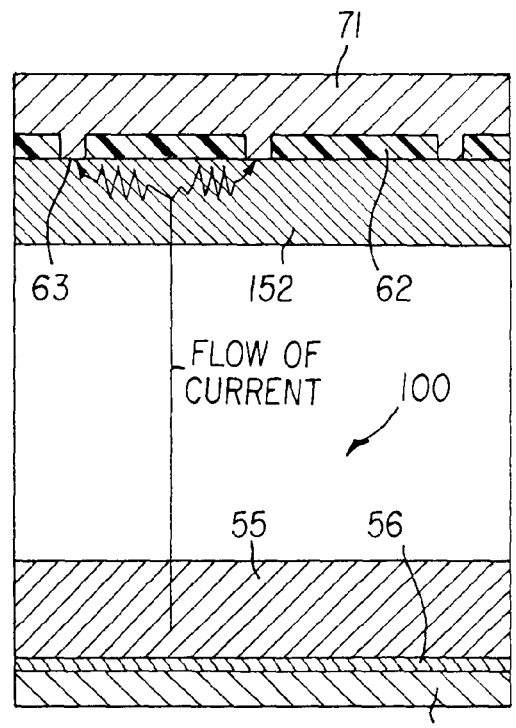
FIG. 30B  FIG. 30C

TRENCH TYPE INSULATED GATE MOS SEMICONDUCTOR DEVICE

CROSS REFERENCE TO RELATED APPLICATIONS

This application claims priority from Japanese applications Serial No. 2007-181025, filed on Jul. 10, 2007, and Serial No. 2007-279761, filed on Oct. 29, 2007. The disclosure of the priority applications, in their entirety, including the drawings, claims, and the specification thereof, is incorporated herein by reference.

BACKGROUND OF THE INVENTION

The present invention relates to a power semiconductor device used under a current with a large current density and particularly to a MOS semiconductor device such as a trench type insulated gate bipolar transistor (hereinafter abbreviated as an IGBT). Specifically, the invention relates to a trench type insulated gate MOS semiconductor device having a plurality of straight-line-like trenches formed on a top surface of a semiconductor substrate, a gate insulator film formed on the inside surface of each of the trenches, and a control electrode buried in each of the trenches with the gate insulator film interposed between to form a trench MOS gate pattern with a plurality of regions on the surfaces of the semiconductor substrate each with first conductivity type regions and second conductivity type regions alternately arranged in the longitudinal direction of the trench between the adjacent ones of a plurality of the straight-line-like trenches.

In compliance with recent requirements for downsizing and performance enhancement in power source equipment in the field of power electronics, efforts have been concentrated on improving performance parameters of a power semiconductor device such as a high breakdown voltage, a high current capacity and along with this, a low power loss, a high breakdown blocking capability and a high operation speed. For a power semiconductor device capable of obtaining such a high current capacity and a low power loss, vertical and trench gate type IGBTs are preferably used in recent years.

A vertical and trench gate type IGBT is driven by a MOS (Metal/Oxide film/Semiconductor) gate. About the structure of the MOS gate, two types are generally well known, i.e. a planar MOS gate structure and a trench gate structure. The planar MOS gate structure has a MOS gate provided in plane-like on the surface of a semiconductor substrate, in which structure a channel current flows in the direction parallel to the surface. While, the trench gate structure has a MOS gate buried in a trench, in which structure a channel current flows in the direction perpendicular to the surface of a semiconductor substrate. Recently, a trench gate type IGBT having a gate electrode buried in a trench has been becoming a focus of attention because the structure thereof can enhance a channel density and provides easiness in obtaining low on-resistance characteristics.

Furthermore, there are two types of structures in the vertical and trench gate type IGBT having such a trench gate structure. FIG. 14 is a cross sectional view showing one of the structures (the structure is provided as that of an example 1 of a related device). As disclosed in the cross sectional view in FIG. 14, the structure of example 1 of a related device has an arrangement in which surface regions 16 and 17 between trenches 13 and a floating p region 12b as a surface region between the trenches 13 are alternately arranged. The trenches 13 are capable of performing a MOS gate function and n+ type emitter regions 16 and p+ type body regions 17 allow an emitter electrode 19 to be in contact thereto. The floating p region 12b is a region to which the emitter electrode 19 is in contact with an insulator film 18 interposed between. The alternate arrangement, when the whole active section (a region in which a main current flows) is viewed from above, can be said as an arrangement that is referred to as being a so-called stripe patterned one. In the floating p region 12b, holes, being hardly emitted to the emitter electrode 19, tend to accumulate in the floating p region 12b to make the carrier concentration distribution in a drift layer 11 of an n-type come close to that in a diode. The floating p region 12b, as explained before, is covered with the insulator film 18 without being provided with the trench gate structure section. This reduces the capacitance between a gate electrode 15 and the emitter electrode 19 by the capacitance of the trench gate structure section to shorten a time for charging or discharging the capacitance of the floating p region 12b, which provides a merit of reducing a switching loss (JP-A-2001-308327 (FIG. 1) (corresponding to U.S. Pat. No. 6,737,705 B2)). The structure is also provided as one in which, in a part of the insulator film 18 covering the surface of the floating p region 12b separated by the trenches 13 as shown in FIG. 14, an unillustrated contact hall is provided to make the emitter electrode 19 contact with the floating p region 12b in a small area to interpose resistance component in the horizontal direction of the substrate in the floating p region 12b between the emitter electrode 19 and the drift layer 11, which provides a merit similar to that as described before (JP-A-2001-308327 (FIG. 1) (corresponding to U.S. Pat. No. 6,737,705 B2) and JP-A-2004-39838).

FIG. 15 is a perspective cross sectional view showing the other structure (the structure is referred to as that of an example 2 of a related device). The structure of example 2 of a related device, as shown in FIG. 15, has an arrangement in which a plurality of trenches 13, each being filled with a gate electrode 15 with a gate insulator film 14 interposed between, are arranged in a surface pattern of a plurality of straight lines and p base regions 12 and regions of an n-type semiconductor substrate as the n-type drift layer 11 are alternately arranged on each surface of the n-type semiconductor substrate as the n-type drift layer 11 between trenches 13 in the longitudinal direction along the trenches 13. In other words, the structure, when the whole active section is viewed from above, can be said as one in which the rows of the p base regions 12 and the rows of the regions of the n-type semiconductor substrate as the n-type drift layer 11 alternately intersect perpendicularly to the parallel trenches 13. In the structure, although the structure is provided as a trench gate structure, a channel current comes to flow not only in the direction perpendicular to the surface of the n-type semiconductor substrate 11 but also in the direction parallel to the n-type semiconductor substrate 11. This makes the vertical and trench gate type IGBT to enable realization of low on-resistance and a high breakdown voltage at the same time (JP-A-2000-228519 (FIG. 6 and FIG. 7) (corresponding to U.S. Pat. No. 6,380,586 B2 and Publication of German Patent Application DE 10 004 548 A)). Moreover, a structure is also presented in which a p base region is surrounded by an n+-type region with an impurity concentration (density) higher than that in the semiconductor substrate to thereby increase a hole concentration (density) near the surface of an n base layer (drift layer) (JP-A-8-316479 (corresponding to U.S. Pat. No. 6,221,721 B2)).

Furthermore, a method is known in which a tradeoff characteristic is improved by thinning a drift layer rather than carrying out the method from the view point of increasing a carrier concentration (density) on the surface side of a drift layer as explained before. For example, there is a punch-through type device in which a thin epitaxial layer with the lowest possible impurity concentration (density) is formed for making the device provided with an n base layer (drift layer) thinned while keeping a specified breakdown voltage. The thinned epitaxial layer is formed on a semiconductor substrate with a high impurity concentration (density) together with a buffer layer with a high impurity concentration (density) to keep the breakdown voltage of the device. Furthermore, there are devices such as a field stop type device in which, between a p-type collector layer, formed on the other principal surface of a semiconductor substrate with the impurity concentration being controlled, and a drift layer formed of the semiconductor substrate, a field stop layer (or a buffer layer) is provided with its thickness and its impurity concentration (density) being controlled.

About the structure and operation of a related vertical and trench type IGBT of an example 2 as described in JP-A-2000-228519 (FIG. 6 and FIG. 7) (corresponding to U.S. Pat. No. 6,380,586 B2 and Publication of German Patent Application DE 10 004 548 A), an explanation will be made with reference to FIG. 15, FIG. 16-1 to FIG. 16-3. FIG. 16-1 to FIG. 16-3 are cross sectional views taken on a cross section A, a cross section B and a cross section C, respectively, shown in FIG. 15. In the following explanations, a "trench type IGBT" is to be referred to as an IGBT having a structure in which a channel current flows in both of the directions perpendicular to and parallel to the substrate as explained before. In the related IGBT of example 2, on one of the principal surfaces (hereinafter referred to as the top surface) of a semiconductor substrate (n⁻-type drain layer) 11, a p base region 12 is selectively formed and, on the other principal surface (hereinafter referred to as the bottom surface), an n-type FS (field stop) layer 50, a p-type collector layer 51 and a collector electrode 22 are formed. Moreover, a number of trenches 13 are formed from the top surface of the substrate to a depth reaching the n⁻-type drain layer 11 over the depth of the p base region 12. On the inner surface of each of the trenches 13, a gate insulator film 14 is formed. On the further inside of the trench 13, a gate electrode 15 of a material such as conductive polycrystalline silicon is buried. On the surface of the p base region 12, a p⁺-type body region 17 is provided at the approximate midpoint between the trenches 13 adjacent to each other. Adjacent to each of the p⁺-type body region 17 and the sidewall of the trench 13, an n⁺-type emitter region 16 is provided. On the gate electrode 15, an insulator film 18 is disposed and, on the whole surface of the active region (a region in which a main current flows) in the unit cell region of the IGBT, a metal electrode (emitter electrode) 19 of a metal such as aluminum is provided. The insulator film 18 insulates and separates the gate electrode 15 from the metal electrode 19. Moreover, openings are provided in the insulator film 18 so that the metal electrode 19 makes common ohmic contact with the surfaces of the n⁺-type emitter regions 16 and the p⁺-type body regions 17.

In the thus arranged vertical and trench type IGBT, by applying a voltage above a specified threshold value to the gate electrode 15, an n-type inversion layer (an n-channel) is formed along the sidewall of the trench 13 in the p base region 12, by which current paths are formed both in the direction perpendicular to and in the direction parallel to the substrate. This makes the vertical and trench type IGBT in a turned-on state between the emitter and the collector. By bringing the voltage applied to the gate electrode 15 to that with the specified threshold value or less, the n-type inversion layer in the p base region 12 disappears to make the vertical and trench type IGBT in a turned-off state between the emitter and the collector. With such a vertical and trench type IGBT, along the sidewall of the trench 13, current paths are formed both in the vertical direction (the vertical direction is referred to as the direction perpendicular to the surface of the semiconductor substrate as shown in FIG. 16-1) and in the lateral direction (the lateral direction is referred to as the direction parallel to the surfaces of the semiconductor substrate as shown in FIG. 16-2). Thus, compared with a related planar gate type or trench gate type IGBT, the areas of the current paths are remarkably expanded. Furthermore, between the trenches 13, minority carriers come to be accumulated in the region where the n-type semiconductor substrate layer 11 is exposed to offer the advantage of also enabling reduction in its on-resistance.

Between the applied voltage and the current density in thus arranged vertical and trench type IGBTs of related examples 1 and 2, there is a correlation, though approximate, in which a current densities are presented at present as 200 A/cm² to 250 A/cm² in a 600V class device, 100 A/cm² to 150 A/cm² in a 1200V class device and 40 A/cm² to 60 A/cm² in a 2500V class device, i.e. the correlation is approximately expressed as V×I≈150 kVA.

However, in the arrangement of the vertical trench type IGBT shown in before presented FIG. 15, there is a problem in that turning-off capability is low. It was found that the problem arises owing to the following cause. This will be explained by using FIG. 15, FIG. 16-1 and FIG. 16-3 again. As was explained about the background art, in the arrangement of the vertical and trench type IGBT shown in FIG. 15, two kinds of current paths are formed. The paths as one of the two are the paths of the currents (shown by arrows) flowing in the longitudinal direction (in the direction perpendicular to the principal surface of the substrate) along the sidewall of the trench of a so-called trench type IGBT as shown in FIG. 16-1, the cross sectional view taken on the cross section A in FIG. 15. The paths as the other of the two are the paths of the currents (shown by arrows) flowing in the lateral direction (in the direction parallel to the principal surface of the substrate) along the sidewall of the trench as shown in FIG. 16-2, the cross sectional view taken on the cross section B in FIG. 15. Of the two kinds of current paths, the current paths of electrons (solid line arrows) flowing in the lateral direction along the sidewall of the trench are rather similar to the electron current paths in a planar gate IGBT. However, compared with the planar gate IGBT in which hole current paths and electron current paths are in the same plane, in the arrangement of the trench type IGBT shown in FIG. 16-2, electron current paths and hole current paths are not present in the same plane. In this point, the trench type IGBT is different from the planar gate IGBT. The hole currents are to flow in the direction from the cross section B to the cross section C shown in FIG. 15. In other words, it can be said that the paths of the hole currents become current paths such that the hole currents flow in from the trench sidewall along a contact plane of an emitter electrode and a semiconductor layer. Therefore, the hole currents are to concentrate beneath the n⁺-type emitter region 16 to pass there. The hole current is equivalent to a base current in an NPN transistor formed with the n⁺-type emitter region/the p base region/the n-type semiconductor substrate layer. It was found that the concentration of the hole current makes the operation of the NPN transistor easy to result in making the operation of a parasitic thyristor of the IGBT easy which thyristor is formed with the n⁺-type emitter region/the p base region/the n-type semiconductor substrate/the p-type collector layer, which makes the turning-off of the IGBT uncontrollable to degrade turning-off blocking capability.

Further in the market, development of a vertical and trench type IGBT is desired which has a capacity of the order of approximately 360 kVA to 600 kVA with such a further higher breakdown voltage and a further higher current density than those of related ones as to be a high breakdown voltage of 1200V class and a current density of 300 A/cm² to 500 A/cm².

When the vertical and trench type IGBT as each of examples 1 and 2 of related devices is used with such a high breakdown voltage and a high current density, the arrangement shown in each of the cross sectional views of FIG. 14 (example 1 of the related device) and FIG. 15 to FIG. 16-3 (example 2 of the related device) sometimes causes avalanche breakdown to occur at turning-off of a large current with gate resistance made relatively low (such resistance causes the current to begin to reduce after a gate voltage is lowered down to a threshold voltage or less), which becomes a problem in reliability. Therefore, in many cases, the gate resistance is made relatively large (with such resistance, a gate voltage determines reduction in current). This case is to be referred to as the latter case.

The behavior of a gate voltage under the turning-off condition like in the latter case will be explained with reference to an equivalent circuit diagram showing a typical IGBT and its gate circuit, which is presented in FIG. 17. As shown in FIG. 17, the behavior of the gate voltage under the turning-off condition of an IGBT will be explained with three kinds of capacitors, a gate-collector capacitor $C_{GC}$, a collector-emitter capacitor $C_{CE}$ and a gate-emitter capacitor $C_{GE}$. In the following, the gate, the collector and the emitter will be represented by abbreviations as G, C and E, respectively. Under the turning-off condition, an increase in the collector-emitter voltage causes a displacement current (iGC) to flow through gate-collector capacitance. When a gate current ig is ig=$i_{GC}$, a gate-emitter current $i_{GE}$ becomes $i_{GE}$=0, by which a period of time appears during which no gate voltage varies (generally referred to as "Miller period").

Under such a state, following two kinds of turning-off states can be considered.

1) The state in which the gate current ig determines $i_{GC}$ (i.e. ig determines $dV_{CE}$/dt).
2) The state in which $i_{GC}$ determines ig (i.e. $dV_{CE}$/dt determines ig).

Namely, when the G-C capacitance is relatively small, the state of 1) appears. Conversely, when the G-C capacitance is relatively large, the state of 2) appears. According to the inventor's investigation effort, it has been found that the turning-off under the state of 2) makes a jumping voltage smaller than the turning-off under the state of 1).

In short, about the behavior after a collector voltage reaches a bus voltage at turning-off, under the state of 1), the way of reduction in the gate voltage determines the current reduction rate of a collector current (di/dt) to determine a jumping voltage (L·di/dt). While, under the state of 2), the increasing rate of the collector voltage still continues to affect the gate current. This makes the way of reduction in the gate voltage gradual compared with the way under the state of 1). As a result, it is said that the current reduction rate (di/dt) in the collector current becomes gradual to make a spike voltage become small.

An effective layer arrangement for obtaining an effect as that under the state of 2) by a simple method is that which brings a region, being in contact with the gate electrode formed in the trench with the gate insulator film interposed between, into a floating state. With such an arrangement, however, there is a problem of causing the device to be broken at static avalanche breakdown.

In addition, when the arrangement is applied under the condition with a large current density as explained above, in the arrangement of the vertical and trench type IGBT having the floating p region as shown in FIG. 14, there is a problem in compatibility between the use at a large current density and the realization of a low on-voltage. According to the inventor's investigation effort, it has become clear that the problem is caused as follows.

This will be explained by using FIGS. 16-1 to 16-3. In general, a saturation current $I_{sat}$ of a MOS semiconductor device is given by the following expression (1):

$$I_{sat} = \frac{1}{(1-\alpha_{PNP})} \frac{\mu_{ns} C_{ox} Z}{2 \cdot L_{CH}} (V_{GE} - V_{GE(th)})^2 \quad (1)$$

where $\alpha_{PNP}$ is a current-amplification factor, $\mu_{ns}$ is carrier mobility in an inversion layer, $C_{ox}$ is capacitance of a gate insulator film, Z is a total emitter width (or length), $L_{CH}$ is a channel length, $V_{GE}$ is a gate bias and $V_{GE(th)}$ is a threshold voltage.

For securing design freedom and for preventing other characteristics (in particular, a breakdown voltage characteristic) from being made sacrificed, the saturation current is desirably adjusted by adjusting the total emitter width (or length) Z. Here, the total emitter width (or length) Z is a width (or length) to which the widths (or lengths) of sections, at each of which the emitter region 16 in a unit cell between the trenches 13 is in contact with the trench 13, are summed about the number of the whole unit cells in a unit area. In the following, although the emitter width will be sometimes referred to as the emitter length, both are equivalent to each other.

While, as was explained in the foregoing, in the arrangement of the vertical and trench type IGBT shown in FIG. 15, two kinds of current paths are formed with the paths of the currents flowing in the direction of the thickness of the substrate in the p base region 12 along the sidewall of the trench 13 of a so-called trench type IGBT as shown in FIG. 16-1, and the paths of the currents flowing in the lateral direction parallel to the principal surface of the substrate in the p base region 12 along the sidewall of the trench as shown in FIG. 16-2. For achieving a low on-voltage, the paths of currents flowing in the lateral direction parallel to the principal surface of the substrate along the sidewall of the trench must be secured.

However, an increase only in the total emitter width (or length), performed for increasing a saturation current according to the expression (1) while maintaining the arrangement of the vertical and trench type IGBT shown in FIG. 15, inevitably causes the emitter region 16 to come close to the end of the p base region 12 in the longitudinal direction of the trench to make it impossible to form paths for allowing sufficient currents to flow in the lateral direction on the side wall of the trench. Thus, it becomes clear that such an arrangement makes it difficult to allow the IGBT to increase a current density and to lower an on-voltage.

The invention was made in view of the foregoing situation and an object of the invention is to provide a vertical and trench type insulated gate MOS semiconductor device which is capable of lowering on-resistance, increasing a current density, enhancing a breakdown blocking capability at avalanche breakdown and inhibiting a jumping voltage at turning-off.

SUMMARY OF THE INVENTION

According to a first aspect of the invention, a vertical and trench type insulated gate MOS semiconductor device includes a semiconductor substrate of a first conductivity type; a base region of a second conductivity type selectively formed on one of the principal surfaces of the semiconductor substrate of the first conductivity type; an emitter region of the first conductivity type selectivity formed on the surface of the base region of the second conductivity type; a body region of the second conductivity type formed on the surface of the base region of the second conductivity type while being in contact with the emitter region of the first conductivity type, the body region having an impurity concentration higher than that of the base region; a plurality of straight-line-like trenches arranged in parallel to form a surface pattern of a plurality of parallel straight lines, each trench being formed from the surface of the emitter region of the first conductivity type to a depth reaching the semiconductor substrate of the first conductivity type while penetrating the base region of the second conductivity type; a gate electrode buried in each of the trenches with a gate insulator film interposed between; and an emitter electrode making common conductive contact with both of the surfaces of the emitter region of the first conductivity type and the body region of the second conductivity type, in which, in a plurality of regions on the surface of the semiconductor substrate each being provided between adjacent ones of a plurality of the straight-line-like trenches arranged in parallel and forming a surface pattern of a plurality of the straight lines, there are included a plurality of first inter-trench surface regions in each of which the surfaces of the base regions of the second conductivity type, each with the emitter region of the first conductivity type and the body region of the second conductivity type formed thereon, and the surfaces of regions each with a portion of the semiconductor substrate of the first conductivity type are alternately arranged along the trench in the longitudinal direction thereof with the emitter electrode being in common contact with both of the surfaces of the emitter region of the first conductivity type and the body region of the second conductivity type; and a plurality of second inter-trench surface regions each of which is formed along the trench in the longitudinal direction thereof with one of the surface of the base region of the second conductivity type and the surface of the semiconductor substrate of the first conductivity type.

According to a second aspect of the invention, in the vertical and trench type insulated gate MOS semiconductor device according to the first aspect of the invention, the surface of the base region of the second conductivity type formed in the second inter-trench surface region is conductively connected to the emitter electrode with intervention of resistance in terms of an equivalent circuit.

According to a third aspect of the invention, in the vertical and trench type insulated gate MOS semiconductor device according to the second aspect of the invention, the resistance intervening between the base region of the second conductivity type and the emitter electrode is less than 100 m$\Omega$/cm$^2$.

According to a fourth aspect of the invention, in the vertical and trench type insulated gate MOS semiconductor device according to any one of the first to third aspects of the invention, the first inter-trench surface regions and the second inter-trench surface regions are alternately disposed with each of the trenches interposed between.

According to a fifth aspect of the invention, in the vertical and trench type insulated gate MOS semiconductor device according to any one of the first to fourth aspects of the invention, the first inter-trench surface regions and the second inter-trench surface regions are arranged at fixed intervals in the transverse direction of the trench.

According to a sixth aspect of the invention, in the vertical and trench type insulated gate MOS semiconductor device according to the fifth aspect of the invention, the fixed interval in the transverse direction of the trench is 5 $\mu$m or less.

According to a seventh aspect of the invention, in the vertical and trench type insulated gate MOS semiconductor device according to the sixth aspect of the invention, in the longitudinal direction of the trench of the first inter-trench surface region, to a repetition pitch for arranging a region including one surface of the base region of the second conductivity type with the emitter region of the first conductivity type formed thereon and one surface of the region with a portion of the semiconductor substrate of the first conductivity type, the proportion of the length of the surface of the emitter region in the surface of the base region of the second conductivity type, with which length the emitter region is in contact with the trench, is one half or more.

According to an eighth aspect of the invention, in the vertical and trench type insulated gate MOS semiconductor device according to the seventh aspect of the invention, the total of the lengths with which the emitter regions of the first conductivity type are in contact with the trench is 30% or more of the total of the longitudinal lengths of the trenches.

According to a ninth aspect of the invention, in a trench gate type insulated gate bipolar transistor including a semiconductor substrate of a first conductivity type to be a drift layer; a base region of a second conductivity type selectively formed on one of the principal surfaces of the semiconductor substrate of the first conductivity type; an emitter region of the first conductivity type selectivity formed on the surface of the base region of the second conductivity type; a plurality of straight-line-like trenches arranged in parallel to form a planar pattern of a plurality of parallel straight lines, each trench being formed from the surface of the emitter region of the first conductivity type to reach the semiconductor substrate of the first conductivity type while penetrating the base region of the second conductivity type; a gate electrode formed in each of the trenches with a gate insulator film interposed between; an emitter electrode making contact with both of the surfaces of the base region of the second conductive type and the emitter region of the first conductivity type; a collector layer of the second conductivity type formed on the other principal surface of the semiconductor substrate of the first conductivity type; a collector electrode in contact with the collector layer; and a field stop layer of the first conductivity type provided between the drift layer as the semiconductor substrate of the first conductivity type and the collector layer of the second conductivity type, the field stop layer having an impurity concentration higher than that of the drift layer and formed with a diffusion depth from the other principal surface being 10 $\mu$m or more, the transistor is provided with a structure in which the base region of the second conductivity type is divided into a first region and a second region by a plurality of the trenches, the surface of the base region in the first region makes the emitter electrode contact directly thereto, and the surface of the base region in the second region makes the emitter electrode contact thereto with an insulator film interposed between to allow a part of a current to flow to the emitter electrode through the second region formed so as to have resistance of less than 100 m$\Omega$/cm$^2$ per unit area.

According to a tenth aspect of the invention, in the trench gate type insulated gate bipolar transistor according to the ninth aspect of the invention, the structure of allowing a part of a current to flow to the emitter electrode through the second region is a structure in which the emitter electrode is connected to the surface of the second region through openings selectively provided in the insulator film on the surface of the second region.

According to an eleventh aspect of the invention, in the trench gate type insulated gate bipolar transistor according to the ninth aspect of the invention, the structure of allowing a part of a current to flow to the emitter electrode through the second region is a structure in which the emitter electrode is connected to an emitter runner placed on the outside of the longitudinal end of each of the first region and the second region.

According to a twelfth aspect of the invention, in the trench gate type insulated gate bipolar transistor according to the tenth or the eleventh aspect of the invention, when avalanche breakdown occurs in a turned-off state, a distance between the collector layer and an end of a space charge region is at least 10 μm or more, the space charge region expanding in the drift layer toward the collector layer from a p-n junction between the first region in the base region of the second conductivity type and the drift layer.

According to a thirteenth aspect of the invention, in a trench gate type insulated gate bipolar transistor including a semiconductor substrate of a first conductivity type to be a drift layer; a base region of a second conductivity type selectively formed on one of the principal surfaces of the semiconductor substrate of the first conductivity type; an emitter region of the first conductivity type selectivity formed on the surface of the base region of the second conductivity type; a plurality of straight-line-like trenches arranged in parallel to form a planar pattern of a plurality of parallel straight lines, each trench being formed from the surface of the emitter region of the first conductivity type to reach the semiconductor substrate of the first conductivity type while penetrating the base region of the second conductivity type; a gate electrode formed in each of the trenches with a gate insulator film interposed between; an emitter electrode making contact with both of the surfaces of the base region of the second conductive type and the emitter region of the first conductivity type; a collector layer of the second conductivity type formed on the other principal surface of the semiconductor substrate of the first conductivity type; a collector electrode in contact with the collector layer; and a field stop layer of the first conductivity type provided between the drift layer as the semiconductor substrate of the first conductivity type and the collector layer of the second conductivity type, the field stop layer having an impurity concentration higher than that of the drift layer and formed with a diffusion depth from the other principal surface being 10 μm or more, in which the emitter electrode makes direct contact with the surface of each base region of the second conductivity positioned between the trenches adjacent to each other, when avalanche breakdown occurs in a turned-off state, a distance between the collector layer and an end of a space charge region is at least 10 μm or more, the space charge region expanding toward the collector layer from a p-n junction formed between the base region of the second conductivity type and the drift layer.

According to a fourteenth aspect of the invention, in the trench gate type insulated gate bipolar transistor according to the ninth or the thirteenth aspect of the invention, the field stop layer has an impurity concentration lower than $1\times10^{16}$ $cm^{-3}$.

According to a fifteenth aspect of the invention, in the trench gate type insulated gate bipolar transistor according to the fourteenth aspect of the invention, the field stop layer has an impurity concentration of $1\times10^{12}$ $cm^{-3}$ or more in a non-space charge region thereof present between the collector layer and an end of a space charge region expanding in the drift layer toward the collector layer from a p-n junction formed between the base region of the second conductivity type and the drift layer when avalanche breakdown occurs in a turned-off state.

According to a sixteenth aspect of the invention, in the trench gate type insulated gate bipolar transistor according to the fifteenth aspect of the invention, the life time of carriers in the drift layer is longer than 1 μs.

According to a seventeenth aspect of the invention, in the trench gate type insulated gate bipolar transistor according to the sixteenth aspect of the invention, in a transistor with a breakdown voltage class of 600V class, the resistivity ($\rho(\Omega cm)$) and the thickness ($tn^-(\mu m)$) of the semiconductor substrate of the first conductivity type have a relation presented by the following expression (1):

$$tn^- > 5 \times \rho - 90. \tag{1}$$

According to an eighteenth aspect of the invention, in the trench gate type insulated gate bipolar transistor according to the sixteenth aspect of the invention, in a transistor with a breakdown voltage class of 1200V class, the resistivity ($\rho(\Omega cm)$) and the thickness ($tn^-(\mu m)$) of the semiconductor substrate of the first conductivity type have a relation presented by the following expression (2):

$$tn^- > 4 \times \rho - 110. \tag{2}$$

According to a nineteenth aspect of the invention, in the trench gate type insulated gate bipolar transistor according to the sixteenth aspect of the invention, in a transistor with a breakdown voltage class of 600V class, the resistivity ($\rho(\Omega cm)$) and the thickness ($tn^-(\mu m)$) of the semiconductor substrate of the first conductivity type have a relation presented by the following expression (3):

$$tn^- > 3 \times \rho - 180. \tag{3}$$

According to a twentieth aspect of the invention, a trench gate type insulated gate bipolar transistor is provided, wherein, in a transistor with a breakdown voltage class of Vmax class, the resistivity ($\rho(\Omega cm)$) and the thickness ($tn^-(\mu m)$) of the semiconductor substrate of the first conductivity type have a relation presented by the following expression (4):

$$N_D \times (tn^- + 0.033 V\max + 70) > 1.54 \times 10^{18} \times V\max^{-0.299} \tag{4}$$

wherein, the correlation between the resistivity and an impurity concentration (density) in the substrate of the first conductivity type $N_D$ has a relation $\rho \times N_D \approx 4.59 \times 10^{16}$.

According to the invention, a trench type insulated gate MOS semiconductor device can be provided which is provided with low on-resistance, a large current density and large breakdown blocking capability at avalanche breakdown to inhibit a jumping voltage at turning-off.

BRIEF DESCRIPTION OF THE DRAWINGS

The invention will now be described with reference to certain preferred embodiments thereof and the accompanying drawings, wherein:

FIG. 11-1 is a cross sectional view taken on a cross section A of FIG. 10;

FIG. 11-2 is a cross sectional view taken on a cross section B of FIG. 10;

FIG. 11-3 is a cross sectional view taken on a cross section C of FIG. 10;

FIG. 16-1 is a cross sectional view taken on a cross section A shown in FIG. 15;

FIG. 16-2 is a cross sectional view taken on a cross section B shown in FIG. 15;

FIG. 16-3 is a cross sectional view taken on a cross section C shown in FIG. 15;

FIG. 21 is a diagram showing presence or absence of breakdown of a 600V class IGBT rushing to avalanche breakdown in a relation between substrate resistivity and substrate thickness;

FIG. 22 is a diagram showing presence or absence of breakdown of a 1200V class IGBT rushing to avalanche breakdown in a relation between substrate resistivity and substrate thickness;

FIG. 26A is a diagram showing waveforms of the collector-emitter voltage $V_{CE}$ and collector current $I_C$ of a 1200V class device, the waveforms being obtained by using the measuring system shown in FIG. 25 when the device rushed to an avalanche breakdown condition without causing breakdown;

FIG. 26B is a diagram showing waveforms of the collector-emitter voltage $V_{CE}$ and collector current $I_C$ of a 1200V class device whose surface structure is different from that of the device shown in FIG. 26A, the waveforms being obtained by using the measuring system shown in FIG. 25 when the device rushed to an avalanche breakdown condition with breakdown;

FIG. 30A is a plan view showing the principal part of an IGBT according to example 2 of the invention;

FIG. 30B is a cross sectional view taken on line A-A of FIG. 30A;

FIG. 30C is a cross sectional view taken on line B-B of FIG. 30A;

DETAILED DESCRIPTION OF THE PREFERRED EMBODIMENTS

In the following, detailed explanations will be made about a vertical and trench type insulated gate MOS semiconductor device according to the invention with reference to drawings. The invention, unless it departs from the spirit and the scope thereof, is not limited to the descriptions of examples that will be explained below.

Figure 1:
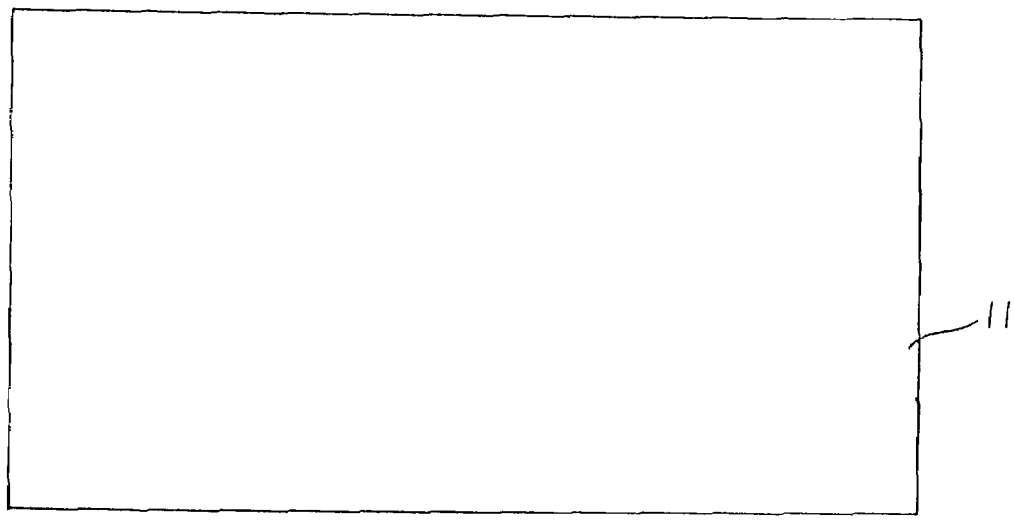
FIG. 1 is a cross sectional view showing the principal part of a silicon substrate in the step of being prepared in the manufacturing process of a trench type IGBT according to example 1 of the invention.
Figure 2:
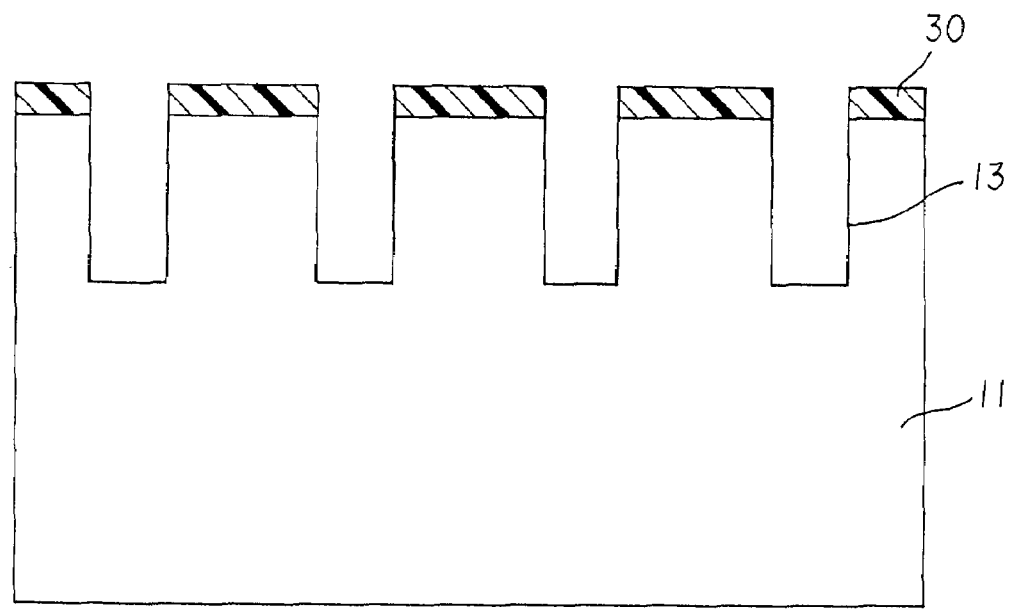
FIG. 2 is a cross sectional view showing the principal part of the silicon substrate in a state in which trenches are formed therein in the step subsequent to the step shown in FIG. 1.
Figure 3:
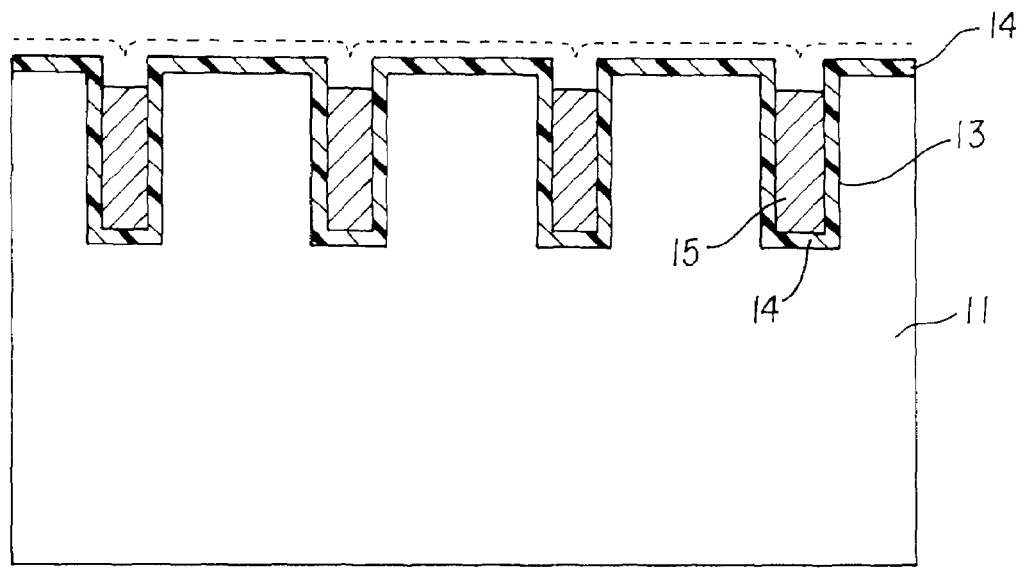
FIG. 3 is a cross sectional view showing the principal part of the silicon substrate in a state in which an oxide film as a gate insulator film is formed on the top surface of the substrate and inside each of the trenches and a gate electrode is buried in each of the trenches in the step subsequent to the step shown in FIG. 2.
Figure 8A:
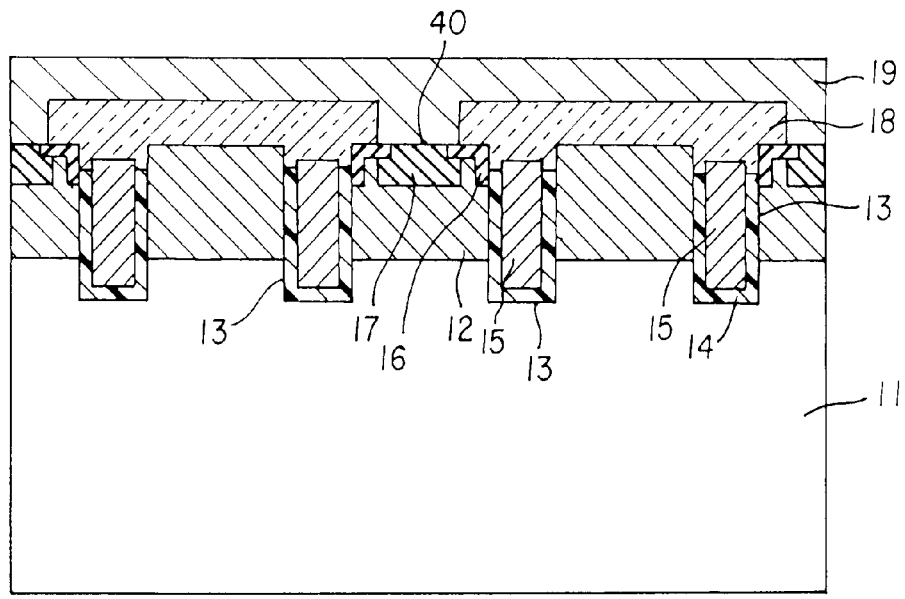
FIG. 8A is a cross sectional view showing the principal part of the silicon substrate in a state in which an insulator film is made deposited on the whole surface of the silicon substrate, emitter contact holes are provided in the insulator film and an emitter electrode is formed on the whole surface in the step subsequent to the step shown in FIGS. 7A and 7B.
Figure 8B:
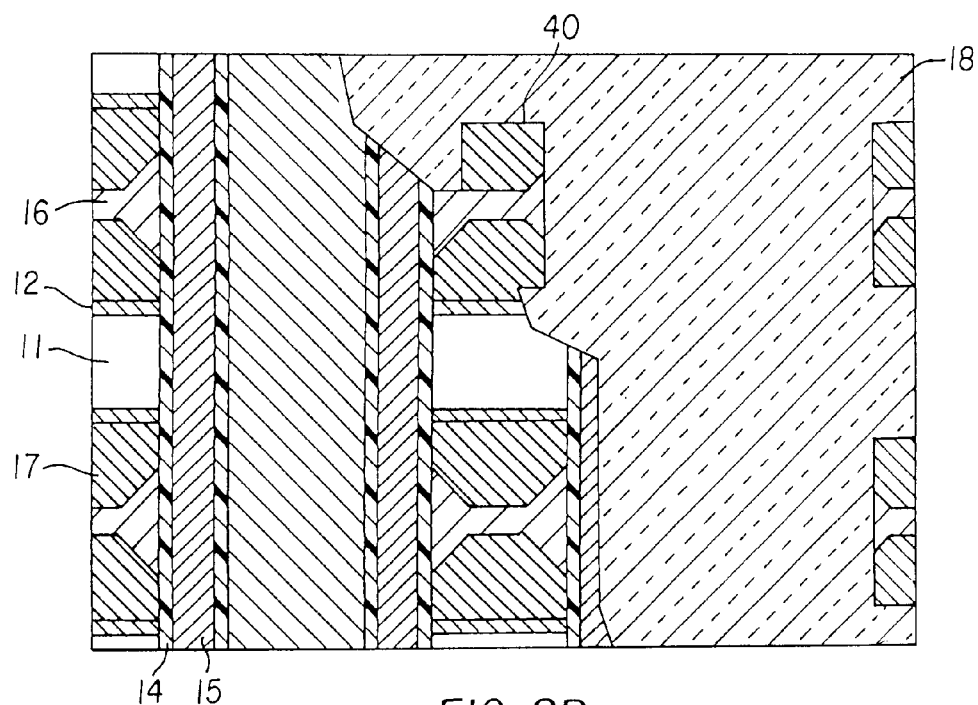
FIG. 8B is a partially cutaway plan view showing the silicon substrate in the step shown in FIG. 8A.
Figure 9:
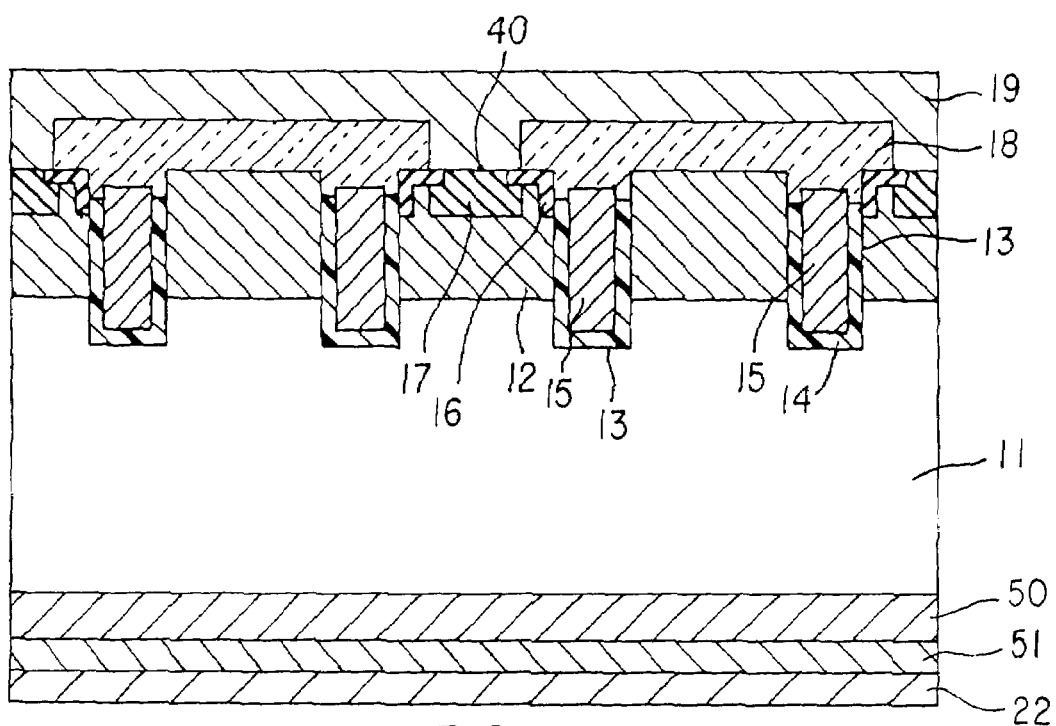
FIG. 9 is a cross sectional view showing the principal part of the silicon substrate in a state in which an n-type buffer layer, a p-type collector layer and a collector electrode are formed in the step subsequent to the step shown in FIGS. 8A and 8B, by which the vertical and trench type IGBT in a wafer stage is completed.
Figure 10:
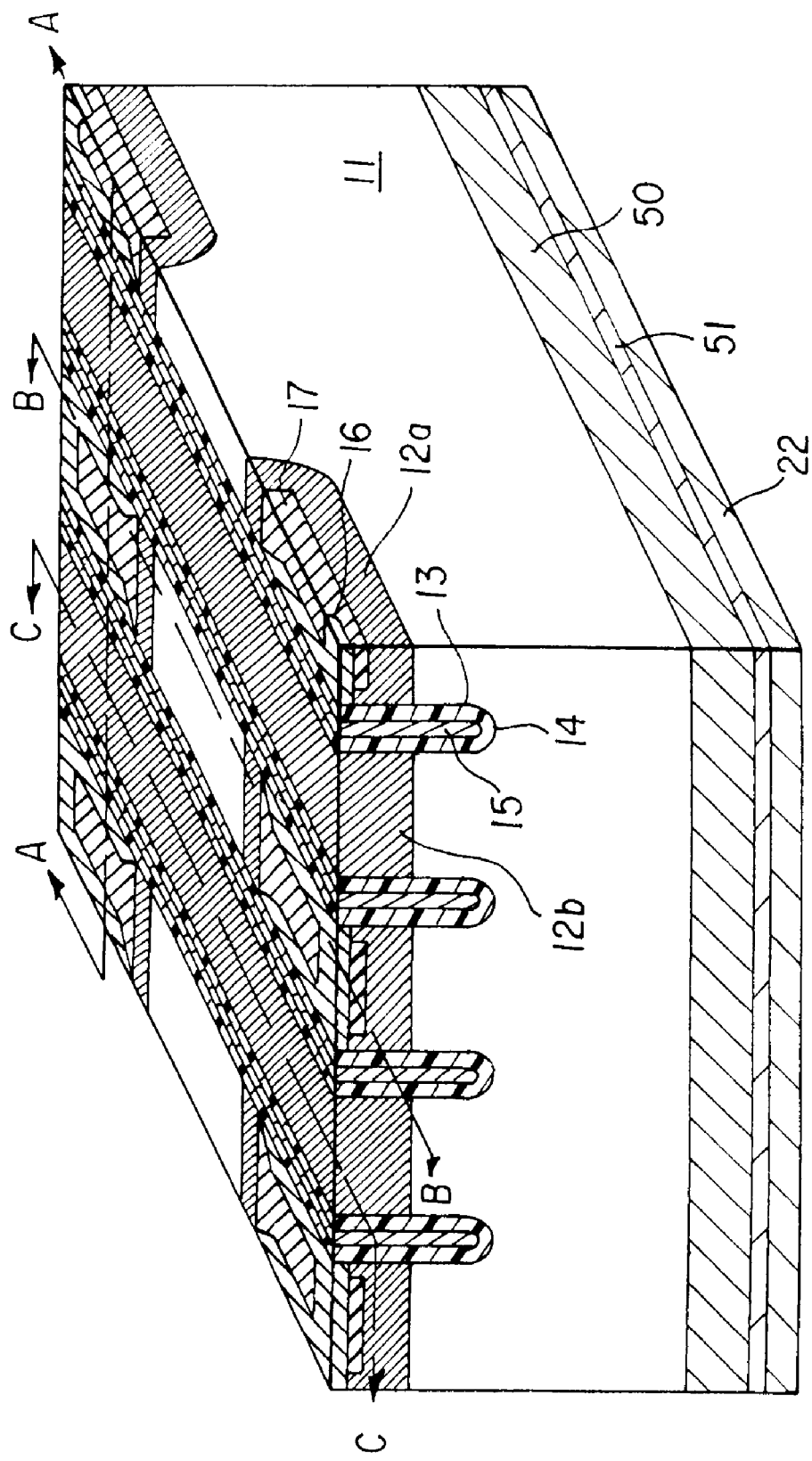
FIG. 10 is a perspective cross sectional view showing the trench type IGBT according to example 1 of the invention.
Figures 1, 11:
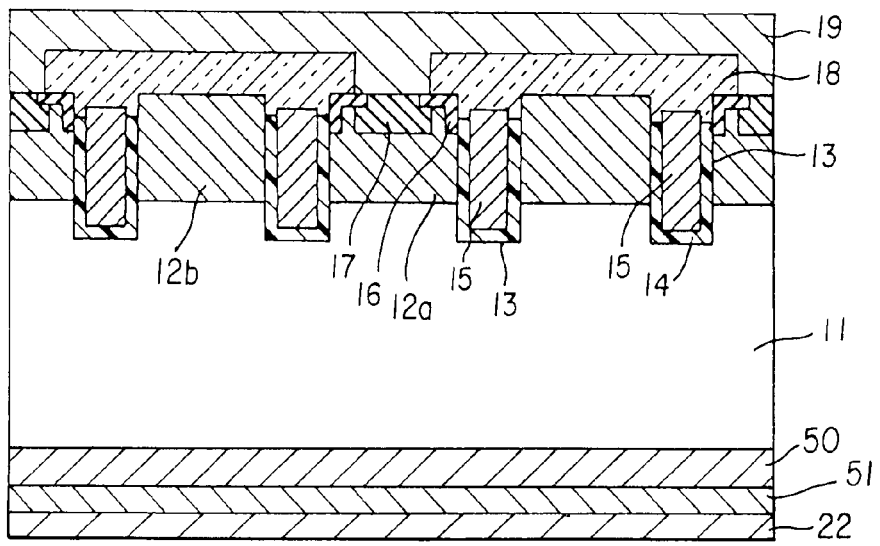
Figures 2, 11:
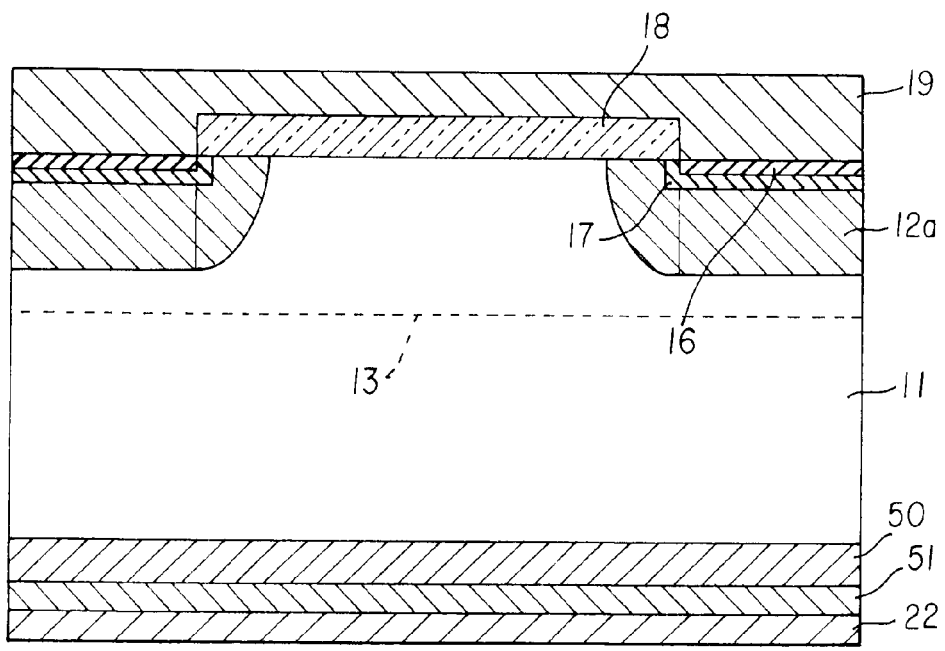
Figures 3, 11:
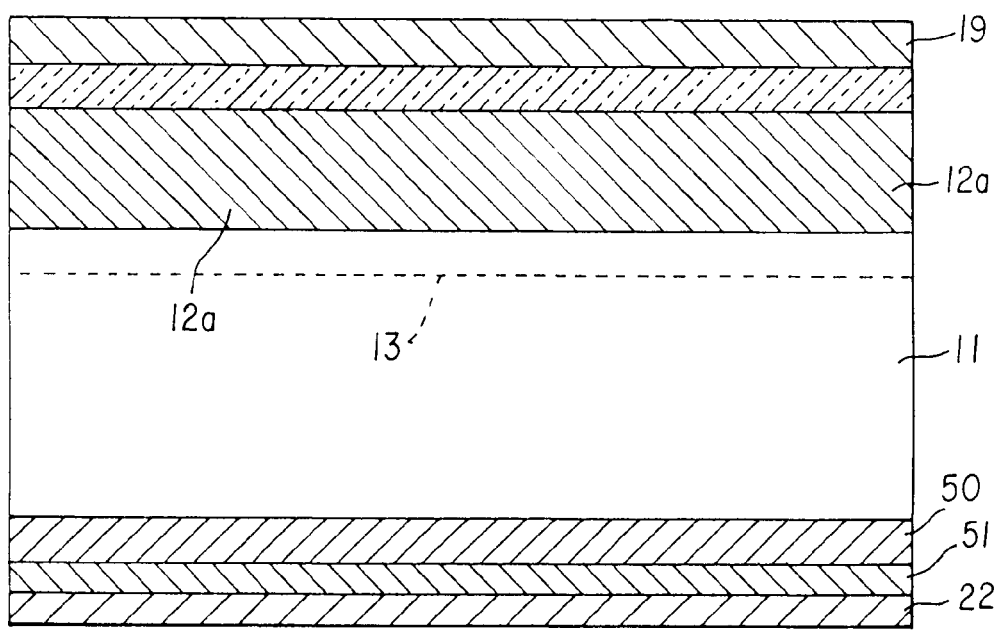
Figure 12:
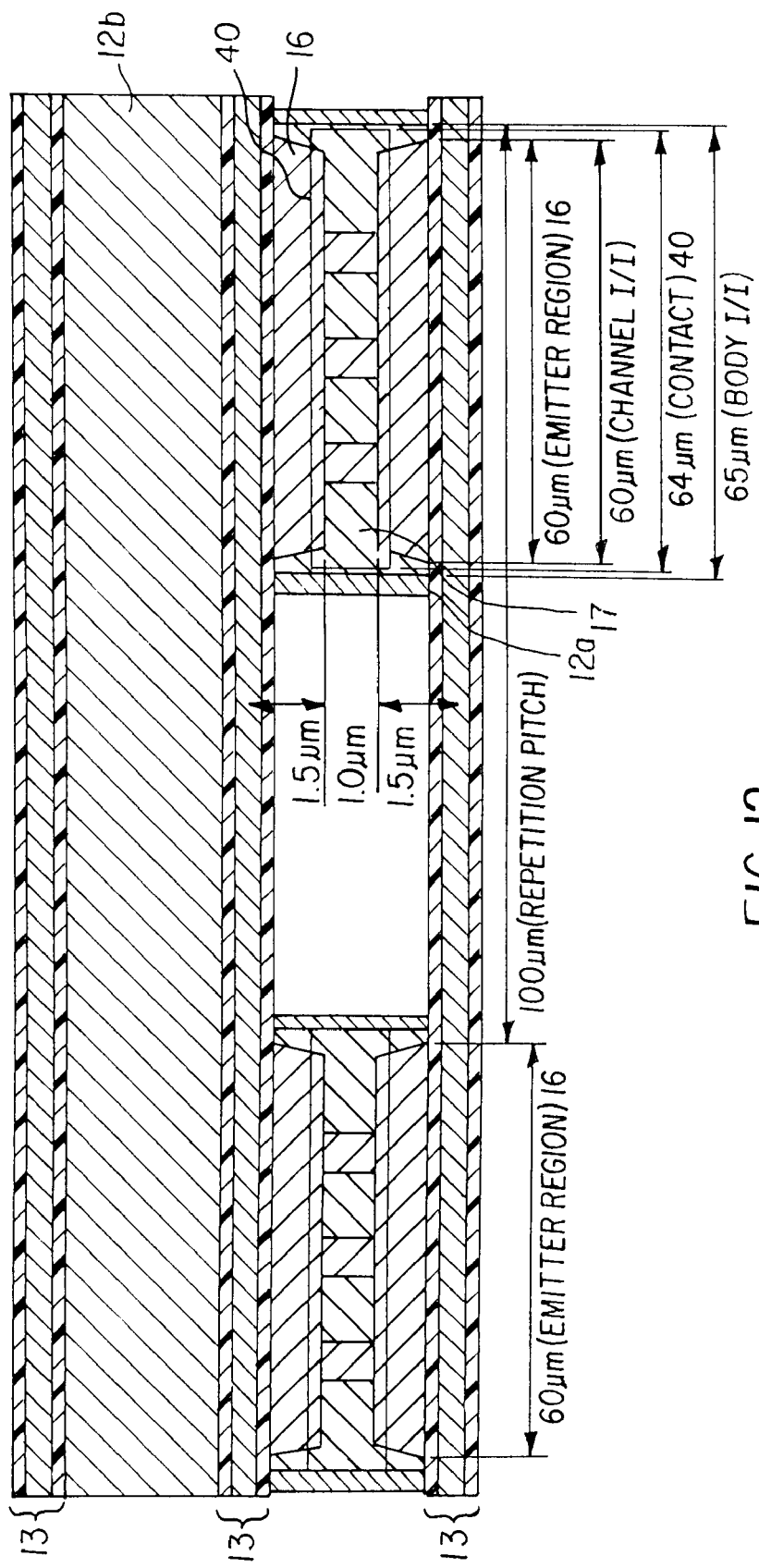
FIG. 12 is a plan view showing the principal part of the trenches and a first and second inter-trench surface regions of the trench type IGBT according to example 1 of the invention.
Figure 13:
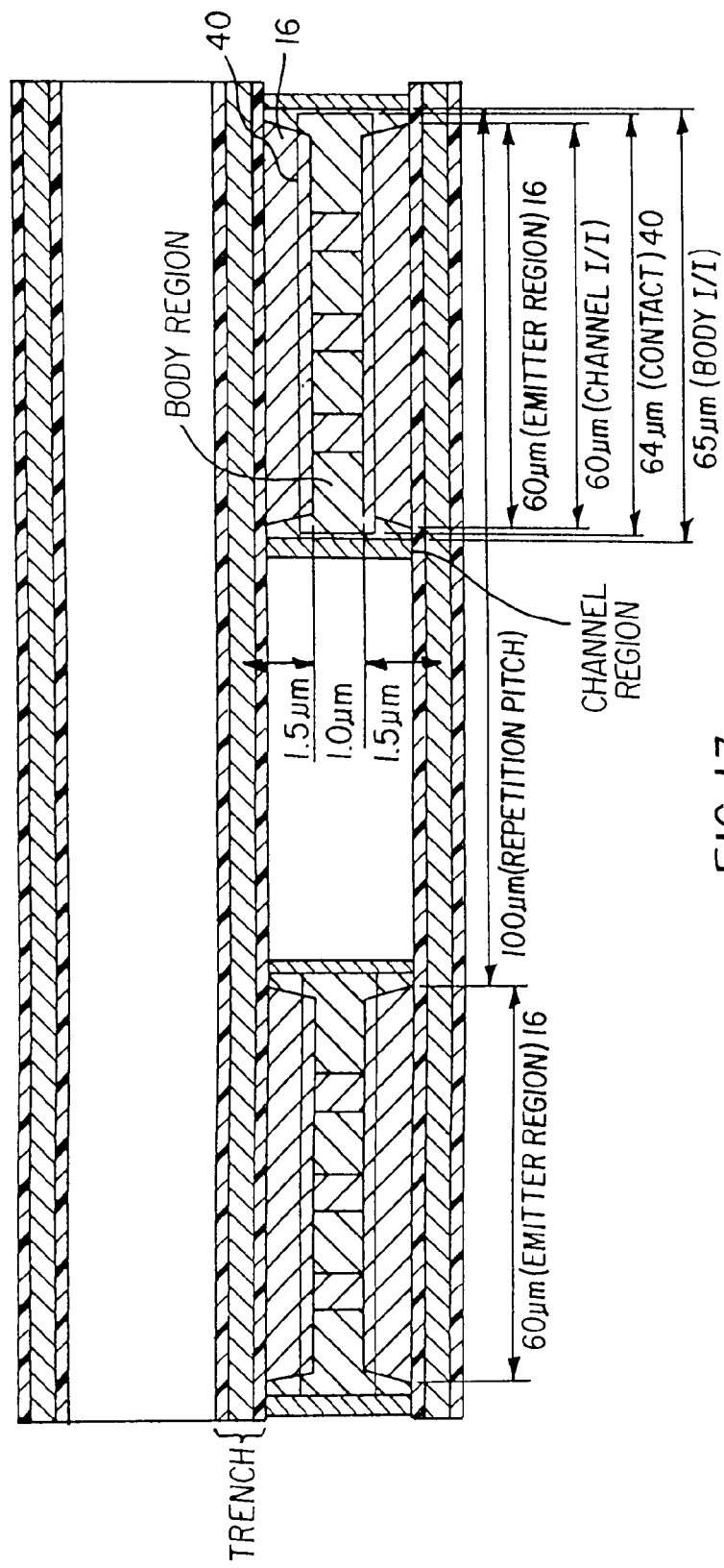
FIG. 13 is a plan view showing the principal part of the trenches and a first and second inter-trench surface regions of the trench type IGBT according to example 1 of the invention with the second inter-trench surface region being different from that shown in FIG. 12.
Figure 18:
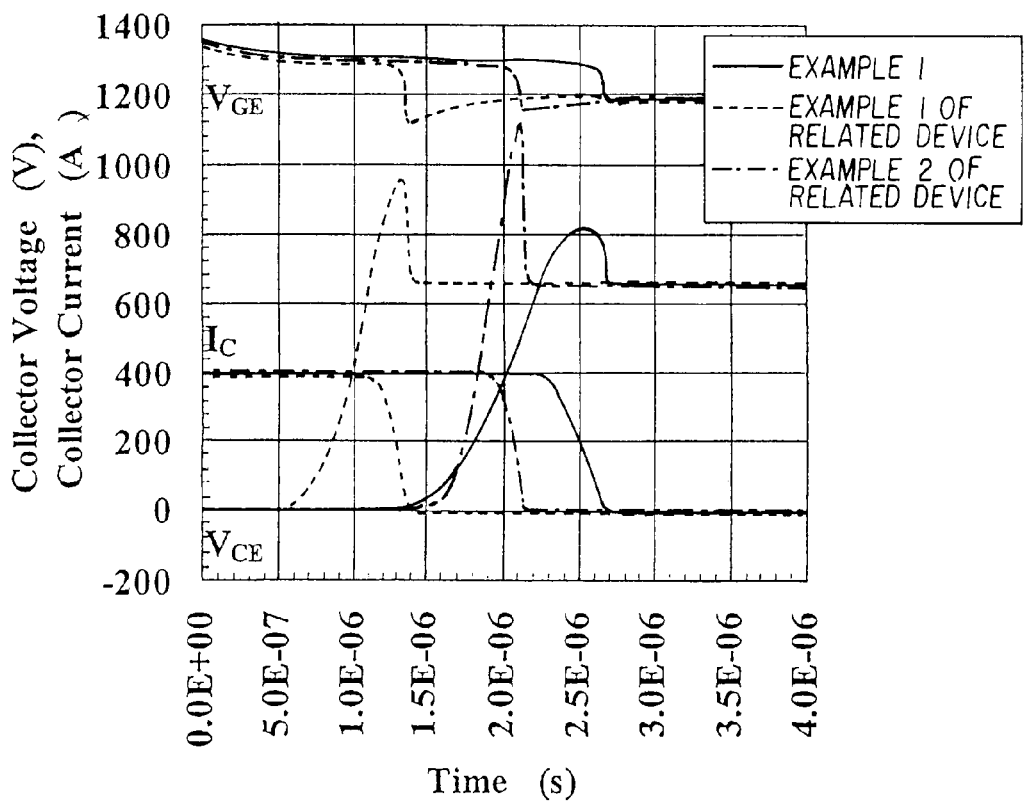
FIG. 18 is a diagram showing a comparison of transient waveforms of the collector current, the collector-emitter voltage and the gate-emitter voltage at the turning-off of the IGBT according to example 1 of the invention with those of examples 1 and 2 of related IGBTs with an elapsed time taken on the horizontal axis.
Figure 19:
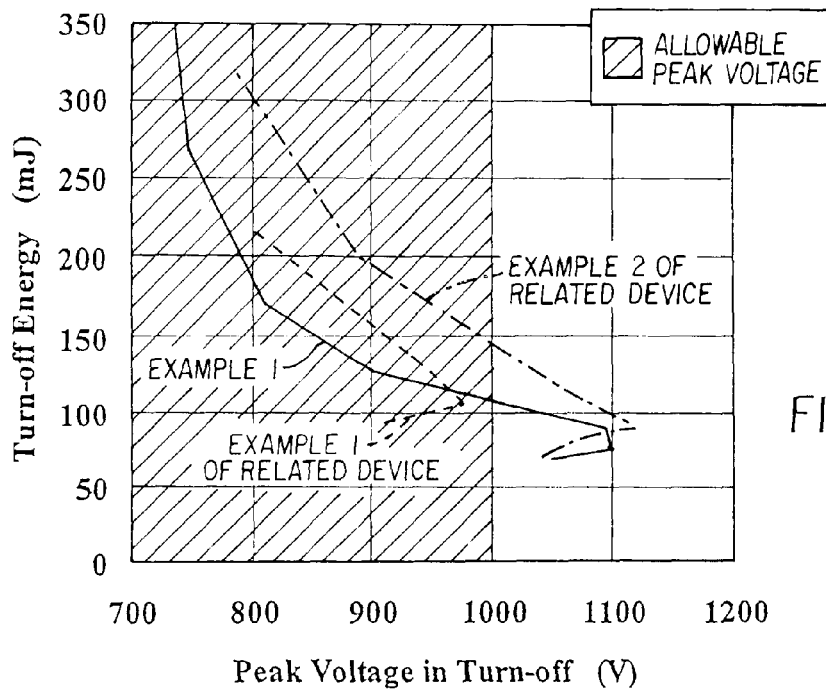
FIG. 19 is a diagram showing a comparison of a relation between the peak jumping voltage and the turn-off loss at the turning-off of the IGBT according to example 1 of the invention with those of examples 1 and 2 of related IGBTs.
Figure 20:
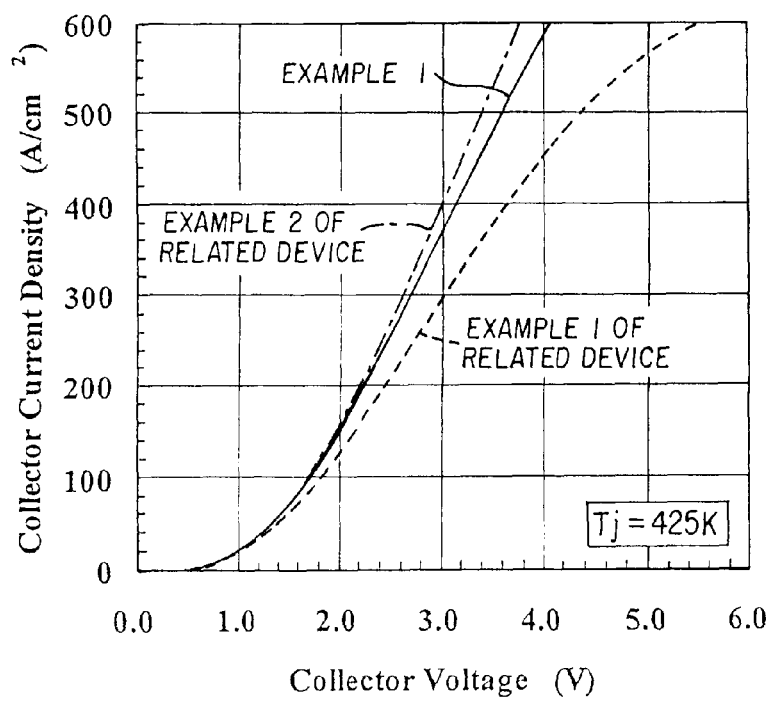
FIG. 20 is a diagram showing a comparison of the I-V characteristic of the IGBT according to example 1 of the invention with those of examples 1 and 2 of related IGBTs.

FIGS. 1 to 9 are cross sectional views showing the principal part of a semiconductor substrate in the order of manufacturing steps in a manufacturing process of a trench type IGBT according to example 1 of the invention together with partly given plan views. FIG. 10 is a perspective cross sectional view showing a trench type IGBT according to example 1 of the invention. FIGS. 11-1 to 11-3 are cross sectional views taken on cross sections A, B and C, respectively, of FIG. 10. FIG. 12 and FIG. 13 are plan views each showing the principal part of the trenches and a first and second inter-trench surface regions of the trench type IGBT according to example 1 of the invention. FIG. 18 is a diagram showing a comparison of transient waveforms of the collector current, the collector-emitter voltage and the gate-emitter voltage at the turning-off of the IGBT according to example 1 of the invention with those of examples 1 and 2 of related IGBTs with an elapsed time taken on the horizontal axis. FIG. 19 is a diagram showing a comparison of a relation between the peak jumping voltage and the turn-off loss at the turning-off of the IGBT according to example 1 of the invention with those of examples 1 and 2 of related IGBTs. FIG. 20 is a diagram showing a comparison of the I-V characteristic of the IGBT according to example 1 of the invention with those of examples 1 and 2 of related IGBTs.

EXAMPLE 1

In the following, explanations will be made with reference to FIG. 1 to FIG. 9 about the example 1 of the vertical and trench type insulated gate MOS semiconductor device according to the invention. In example 1, a trench type IGBT with a breakdown voltage of 1200V is particularly taken as an example and its manufacturing process will be explained.

First, like in a related device, an $n^-$-type silicon semiconductor substrate 11 to be an $n^-$ base region 11 is prepared as shown in FIG. 1. The $n^-$-type silicon semiconductor substrate 11 has a surface whose direction of crystal plane is (100) and has a resistivity of 50 Ωcm. On the surface of the substrate 11, a resist mask pattern is formed for forming a guard ring not shown, p-type impurity ions are implanted, and heat treatment is carried out after the resist is removed. Thus, a guard ring layer is formed around a chip. At the heat treatment, an oxide film 30 shown in FIG. 2 is formed, in which openings for forming trenches are formed by photolithography. Then, as shown in FIG. 2, the semiconductor substrate 11 is subjected to anisotropic gas etching down to a specified depth, by which trenches 13 are formed.

In example 1, the trenches 13 were formed by providing in the oxide film 30 openings forming a plan view pattern of a plurality of straight lines spaced 4 μm apart (a spacing between the trenches), each having a width of 0.8 μm, and by carrying out anisotropic RIE (Reactive Ion Etching) from the surface of the substrate 11 perpendicularly thereto. Then, for removing a defect layer on each of etched surfaces formed when forming the trenches 13 in the silicon substrate 11, an oxide film is first formed inside of each of the trenches 13 by sacrifice oxidation. Thereafter, by removing the oxide film, the defect layer formed accompanied with the formation of each of the trenches 13 is removed. Then, all of the oxide films in each of unit cell regions are once removed and a gate insulator film 14 with a film thickness of 140 nm to 170 nm is thereafter newly formed over the top surface of the substrate 11 and the inside of each of the trenches 13 as shown in FIG. 3.

Next to this, as shown in FIG. 3 together with a dotted line, a polycrystalline silicon film 15 highly doped with impurity atoms (such as phosphorus atoms or boron atoms), for example, with a film thickness of 0.5 to 1.0 μm is made deposited on the whole surface of the substrate 11 by a reduced pressure CVD method, by which each of the trenches 13 is filled with polycrystalline silicon 15 made conductive (doped polycrystalline silicon). Subsequent to this, etching back of the doped polycrystalline silicon 15 is carried out by anisotropic or isotropic gas etching, for example. By stopping the etching of the polycrystalline silicon 15 at the step at which the oxide film 14 on the top surface of the silicon substrate 11 is exposed, the gate electrode 15 buried in each of the trenches 13 is controlled to have an adequate height as shown in FIG. 3. At this time, the polycrystalline silicon 15 is removed from the top of the trench 13 by the etching back by a thickness approximately equivalent to the film thickness of the polycrystalline silicon 15 deposited over the surface of the silicon substrate 11. Thus, the gate electrode 15 is etched to a depth of the order of 100 to 150 nm from the top of the trench 13.

Figure 4:
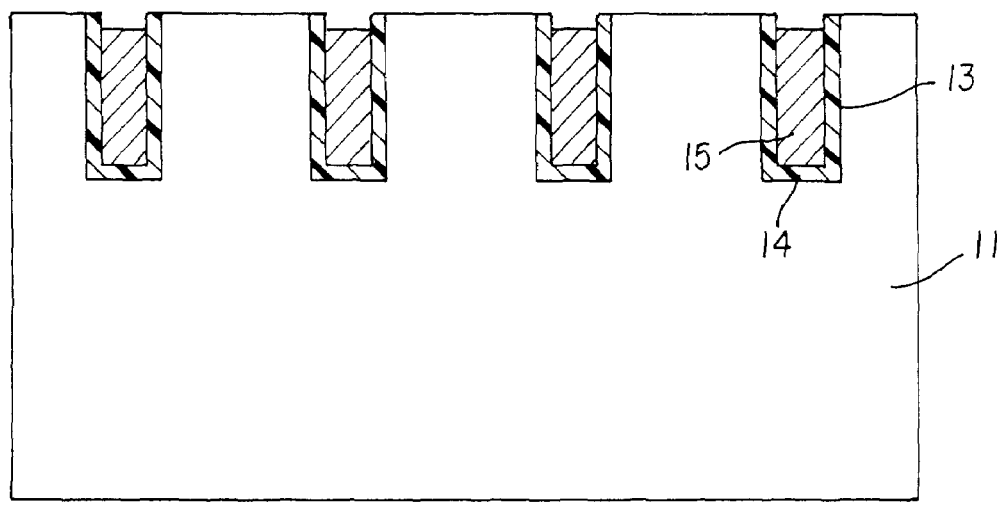
FIG. 4 is a cross sectional view showing the principal part of the silicon substrate in a state in which the oxide film on the top surface of the substrate is removed in the step subsequent to the step shown in FIG. 3.

Then, as shown in FIG. 4, the oxide film 14 on the top surface side of the silicon substrate 11 is removed so that the surface of the silicon substrate 11 is made exposed. At this time, the use of anisotropic etching is preferable because the oxide film 14 on the sidewall of the trench 13 is left as being thick without being etched. As a result, the surfaces, to which ion implantation is carried out later for forming a p base region 12 (and a p+body region 17) and an $n^+$ emitter region 16, are made flush with one another. In addition, the p base region 12 is to be formed after the trenches 13 are formed. This enables the diffusion depth of the p base region 12 to be made shallow. Further, boron atoms are conveniently prevented from being taken in the oxide film while the thermal oxide film is being formed.

Figure 5A:
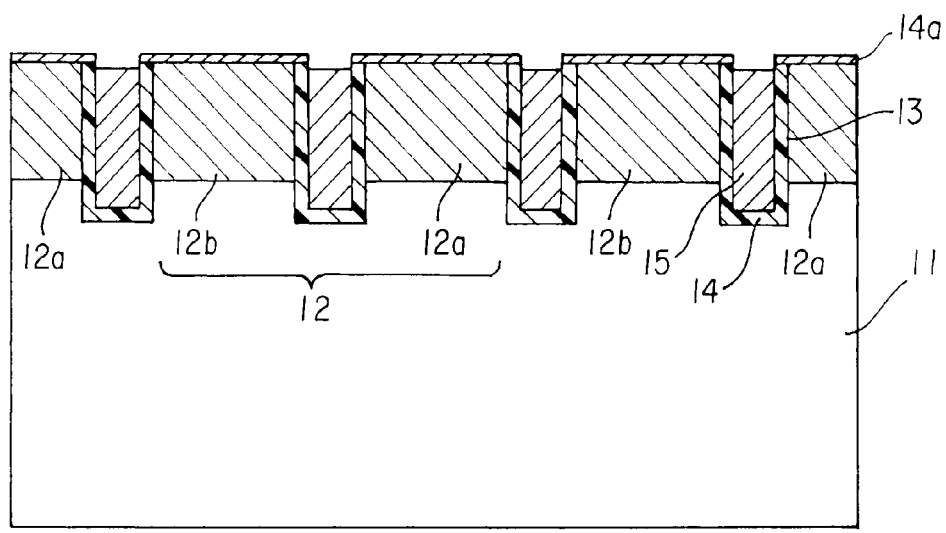
FIG. 5A is a cross sectional view showing the principal part of the silicon substrate in a state in which a p-type diffusion regions are formed on the top surface side thereof in the step subsequent to the step shown in FIG. 4.
Figure 5B:
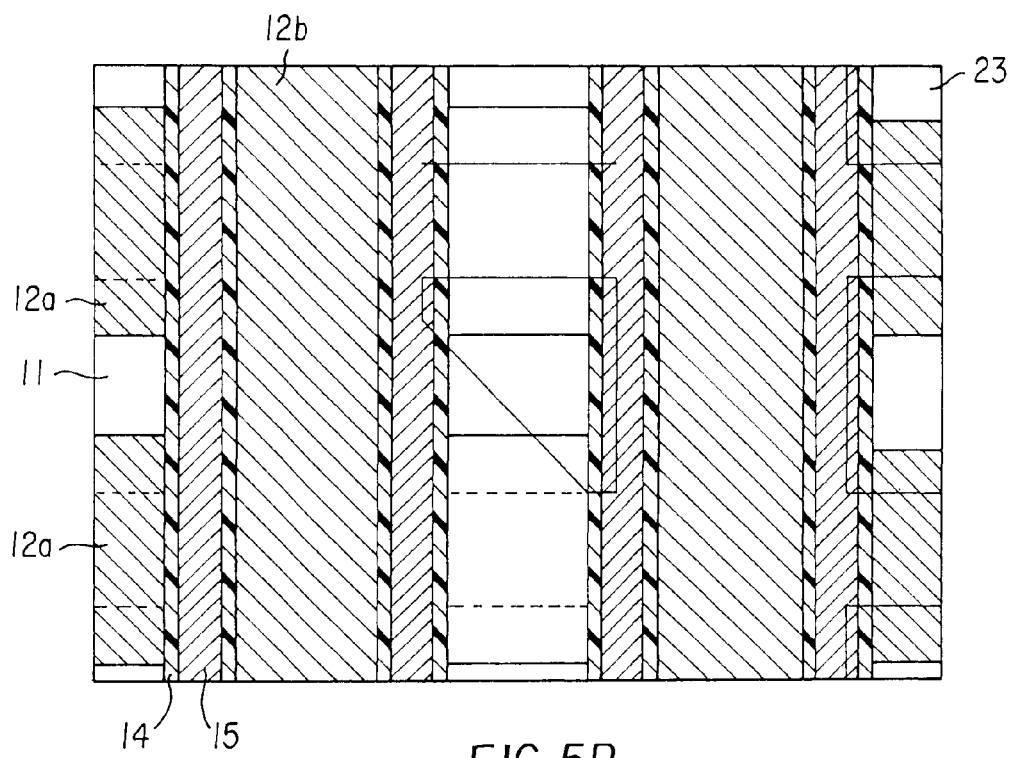
FIG. 5B is a plan view showing the silicon substrate in the step shown in FIG. 5A.

Next, as shown in FIG. 5A, a thermal oxide film 14a is formed with a thickness of allowing boron ions or arsenide ions to sufficiently pass through, 20 nm to 50 nm, for example. As shown in FIG. 5A and FIG. 5B, a plan view of the substrate shown in FIG. 5A, in a part of the unit cell region, a p-type diffusion region to be a p base region 12a and a p-type diffusion region to be a floating p region 12b are formed by ion implantation with an acceleration voltage of the order of 50 keV and a dose of the order of $1 \times 10^{13}$ cm$^{-2}$ to $5 \times 10^{14}$ cm$^{-2}$ and thermal diffusion processing at a temperature of the order of 1100° C., for example. By adjusting the dose, the threshold value of the gate voltage of a MOS semiconductor device at room temperature can be adjusted to the order of 6V.

In example 1, in a first inter-trench surface region as a surface region in which the surfaces of the p base regions 12a and the surface regions of the semiconductor substrate 11 are alternately arranged in the longitudinal direction between the trenches 13, a repetition pitch ($Z_{Unit}$) being a sum of the length of the surface region of the p base region 12a into which boron ions are implanted and the length of the surface region of the semiconductor substrate 11 into which no boron ions are implanted, is taken as 100 μm. While, to the repetition pitch, the proportion of the length of the emitter region, later formed in the p base region 12a in which boron ions are implanted, is to be represented as $R_{Emitter}$ (the length of the face with which the emitter region contacts the trench/the repetition pitch), which is taken as 60%. That is, the length of the p base region 12a is taken as 60 μm. Moreover, a second inter-trench surface region as the surface region of the floating p region 12b, into the whole surface of which boron ions are implanted between the trenches 13, and the first inter-trench surface region are made to be alternately arranged in the transverse direction of the trenches 13 on the planar pattern of a plurality of the parallel trenches 13 on the surface of the semiconductor 11.

Figure 6A:
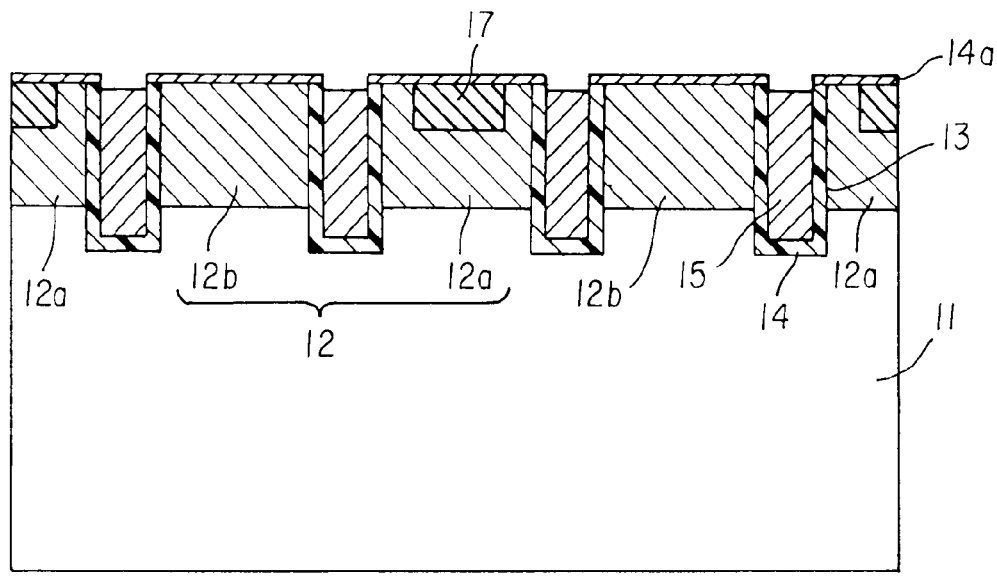
FIG. 6A is a cross sectional view showing the principal part of the silicon substrate in a state in which $p^+$-type body regions are formed on the top surface side thereof in the step subsequent to the step shown in FIGS. 5A and 5B.
Figure 6B:
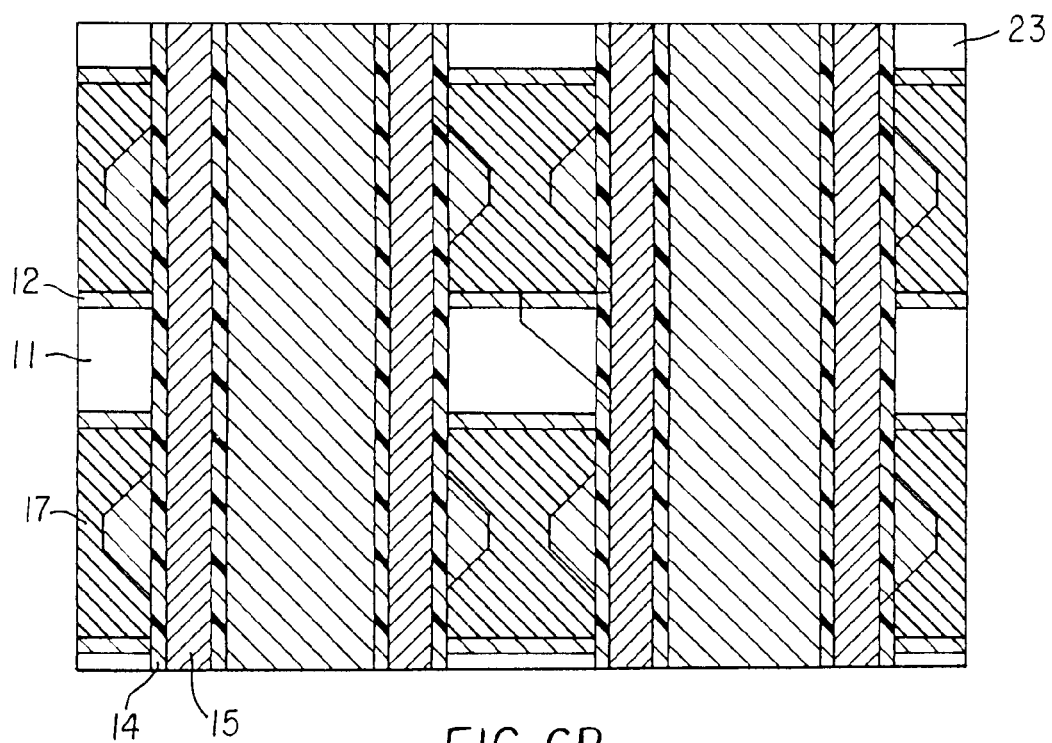
FIG. 6B is a plan view showing the silicon substrate in the step shown in FIG. 6A.

Subsequent to this, a p$^+$-type body region 17 is formed on the surface region of the p base region 12a with a planar pattern as shown in FIG. 6B as a plan view. The p$^+$-type body region 17 is formed by providing a resist mask over the surface of the semiconductor substrate 11, forming an opening in the resist mask at the portion to be the p$^+$-type body region 17 with a photolithography and carrying out boron ion implantation with an acceleration voltage of the order of 100 keV and a dose of the order of $1 \times 10^{15}$ cm$^{-2}$ to $5 \times 10^{15}$ cm$^{-2}$ and thermal diffusion processing at a temperature of the order of 1000° C. In this example 1, the p$^+$-type body region 17 into which boron ions are implanted was formed with the length in the longitudinal direction of the trench 13 taken as 65 μm, 60% ($R_{Emitter}$) of the repetition pitch ($Z_{Unit}$) of approximately 100 μm with an additional length of 5 μm, and the minimum width in the transverse direction of the trench 13 taken as 1 μm so that the section with the minimum width is laid out in the middle section between the trenches 13.

Figure 7A:
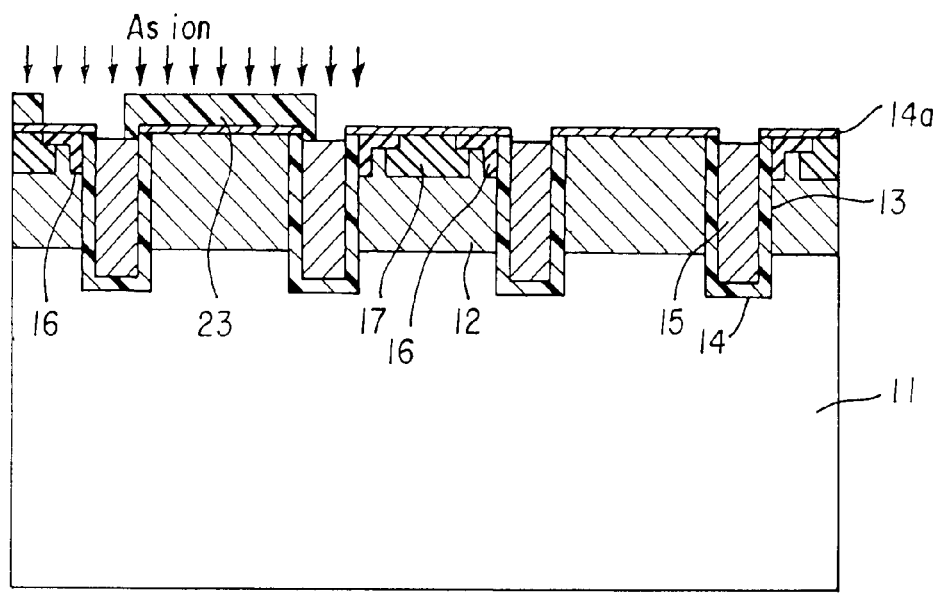
FIG. 7A is a cross sectional view showing the principal part of the silicon substrate in a state in which $n^+$-type emitter regions are formed on the top surface side thereof in the step subsequent to the step shown in FIGS. 6A and 6B.
Figure 7B:
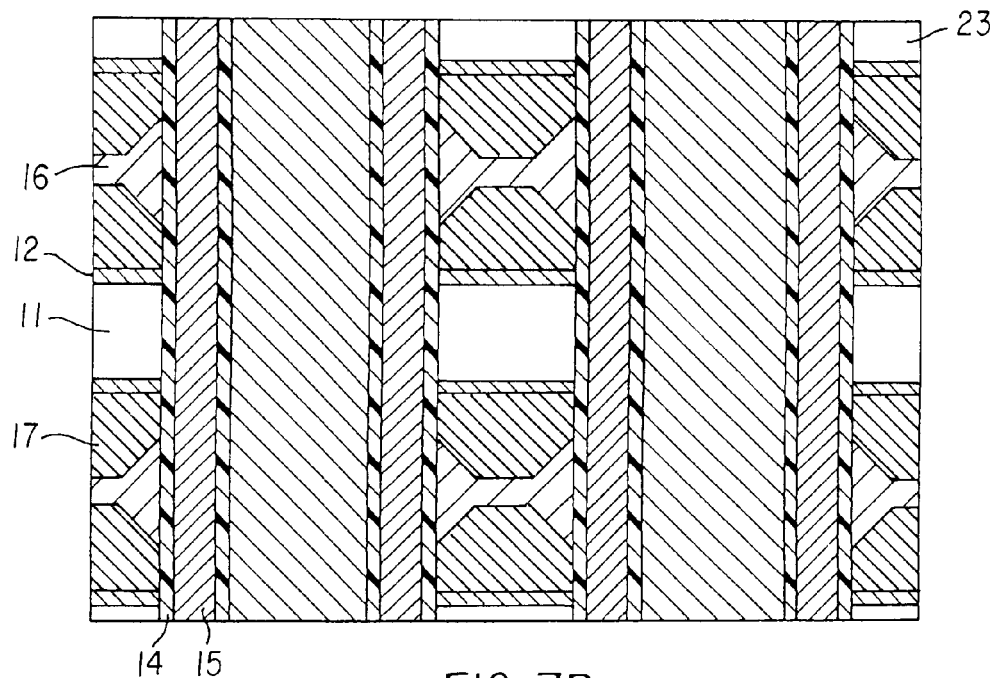
FIG. 7B is a plan view showing the silicon substrate in the step shown in FIG. 7A.

Following this, as shown in FIGS. 7A and 7B, a resist mask 23 is provided again over the surface of the semiconductor substrate 11 and an opening is formed in the resist mask 23 by photolithography. Then by carrying out subsequent arsenic (As) ion implantation and heat treatment, the n$^+$-type emitter region 16 is formed. The proportion $R_{Emitter}$ of the length in the longitudinal direction of the trench 13 of the emitter region 16 to the repetition pitch (length) was taken as 60%. The ion implantation for forming the emitter region 16 is carried out with an acceleration voltage of the order of 100 keV to 200 keV and a dose of the order of $1 \times 10^{15}$ cm$^{-2}$ to $5 \times 10^{15}$ cm$^{-2}$ as shown by arrows in FIG. 7A, for example.

Subsequent to this, as shown in FIGS. 8A and 8B, an insulator film 18 of a material such as BPSG (Boro Phospho Silicate Glass) is made deposited on the whole surface of the substrate 11. As a result, on the gate electrode 15 in the trench 13, the insulator film 18 is formed which keeps insulation against an emitter electrode 19 deposited thereon. The insulator film 18 is subjected to pattern etching by photolithography to have an emitter contact hole 40 opened which exposes the emitter region 16 and the p$^+$ body region 17 on the surface of the substrate 11. At this time, the opening length of the emitter contact hole 40 in the longitudinal direction of the trench 13 is made to be longer than the length of the emitter region 16 in the longitudinal direction of the trench 13. For example, in example 1, as shown in FIG. 12, the opening length of the emitter contact hole 40 in the longitudinal direction of the trench 13 is made 4 μm longer than the length of the emitter region 16 which is 60% of the repetition pitch (100 μm). Namely, the length is given as approximately 100 μm ($Z_{Unit}$)×60% ($R_{Emitter}$)+4 μm=64 μm. Similarly, the opening width of the emitter contact hole 40 in the transverse direction of the trench 13 was provided so as to be 1 μm.

Then, metallic material such as aluminum film is made deposited by sputtering on the surface of the substrate 11. The deposited metal film is then subjected to patterning by photolithography before being heat-treated, by which a metal electrode layer to be the emitter electrode 19 (FIG. 8A) is formed on the whole surface of the unit cell region. Furthermore, on the emitter electrode 19, a passivation film such as a polyimide film (not shown) is deposited over the whole surface of a chip.

Then, the semiconductor substrate 11 is made thinned by polishing carried out from the other principal surface to a specified thickness (on the order of 120 μm to 140 μm). Thereafter, as shown in FIG. 9, on the other principal surface having been polished, an n-type buffer layer (or an n-type field stop layer) 50 and a p-type collector layer 51 are formed by ion implantation and heat treatment before a collector electrode 22 is formed, by which a vertical trench type IGBT in a wafer stage is completed. Here, some shapes of IGBTs have no n-type buffer layer (or n-type field stop layer) 50 formed. Moreover, for the semiconductor substrate put into a manufacturing process, an n$^-$/n$^{++}$/p$^{++}$ substrate can be also used without forming the n-type buffer layer 50 and the p-type collector layer 51 by ion implantation and heat treatment.

With the manufacturing process as was explained in the foregoing, it is predicted that the gate electrode 15 and the emitter region 16 are separated from each other like in a device provided by the related process. Thus, the emitter region 16 must be heat-treated for a relatively long time. In such a case, the impurity concentration in the emitter region 16 is reduced to sometimes cause difficulty in providing the ohmic contact between the emitter electrode 19 as a metal electrode and the emitter region 16. In this case, the emitter region 16 is formed with the process divided into two steps, by which the emitter region 16 can be provided with a high surface impurity concentration that makes the ohmic contact easy. Namely, after the p base region 12 is formed, a first stage of the n$^+$-type emitter region 16 is formed before forming the p-type body region 17 and a resist mask is provided over the portion for forming a second stage of the n$^+$-type emitter region 16. Furthermore, an opening is formed in the resist mask by photolithography at the portion becoming the second stage of the n$^+$-type emitter region 16. By carrying out ion implantation with arsenide ions, for example, into the opening and followed heat-treatment there, the $n^+$-type emitter region 16 is formed. This provides a structure that easily makes the ohmic contact between the $n^+$-type emitter region 16 and the metal electrode excellent.

The surface pattern of the unit cell in example 1 of the invention has dimensions as shown in the plan view in FIG. 12 when the proportion $R_{Emitter}$ of the length of the $n^+$-type emitter region 16 is taken as 60%. FIG. 13 is a plan view showing a structure of a planar pattern in which the second inter-trench surface region in FIG. 12 is formed directly with the semiconductor substrate 11 without forming the floating p region 12b. Both are the planar patterns in the principal parts of the IGBTs according to the first aspect of the invention.

Figure 14:
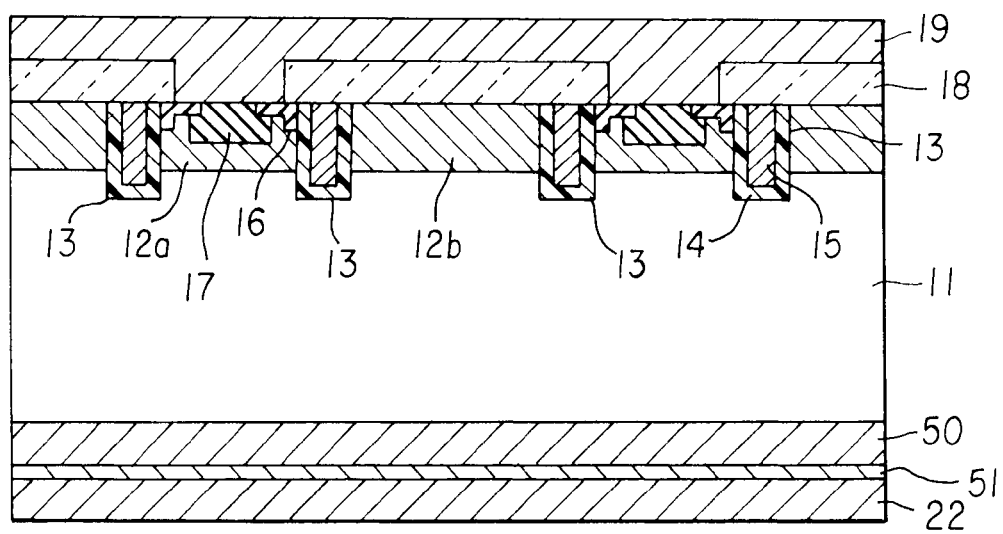
FIG. 14 is a cross sectional view showing the structure of example 1 of a related trench type IGBT.
Figure 15:
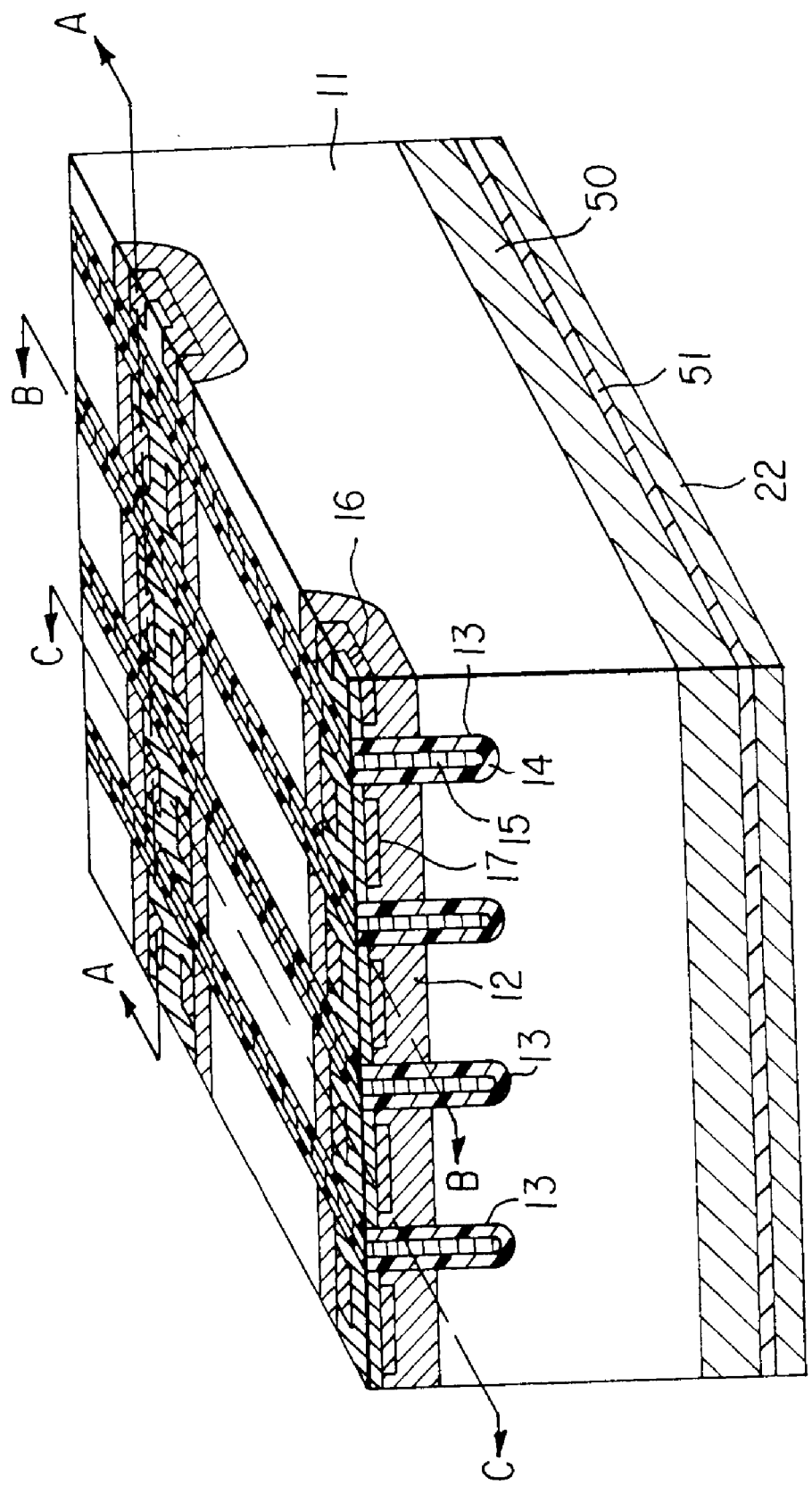
FIG. 15 is a perspective cross sectional view showing the structure of example 2 of a related trench type IGBT.
Figures 1, 16:
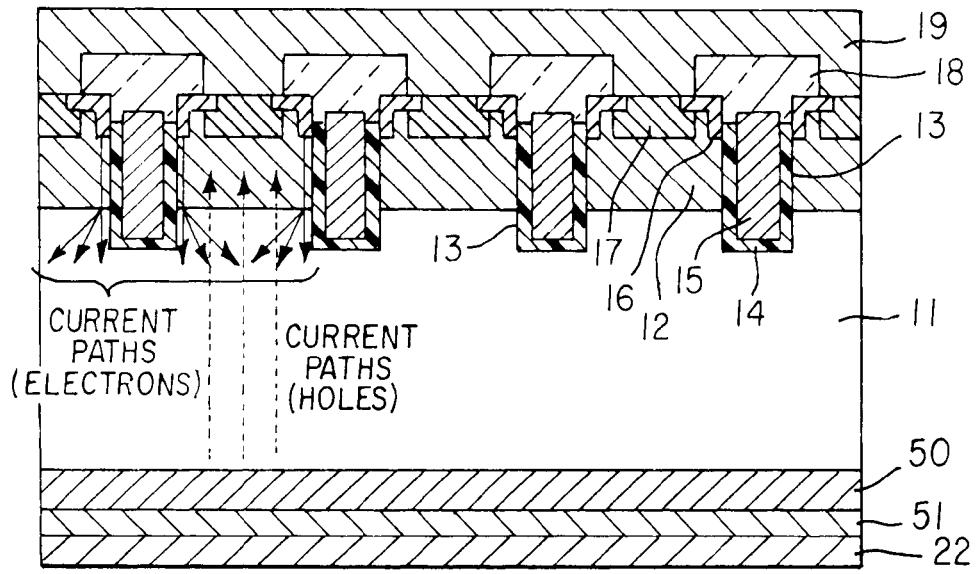
Figures 2, 16:
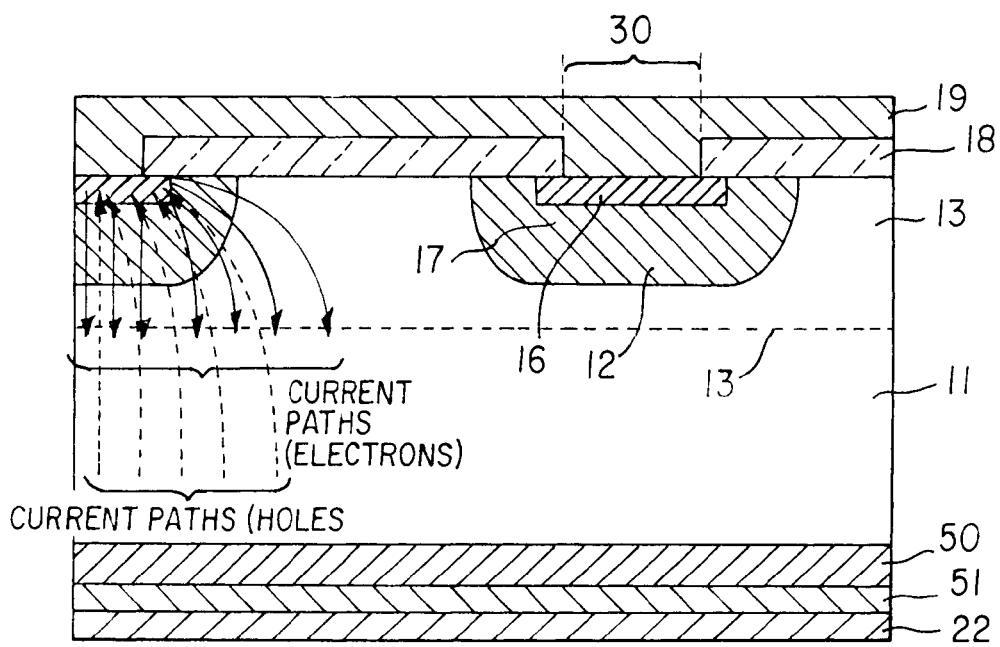
Figures 3, 16:
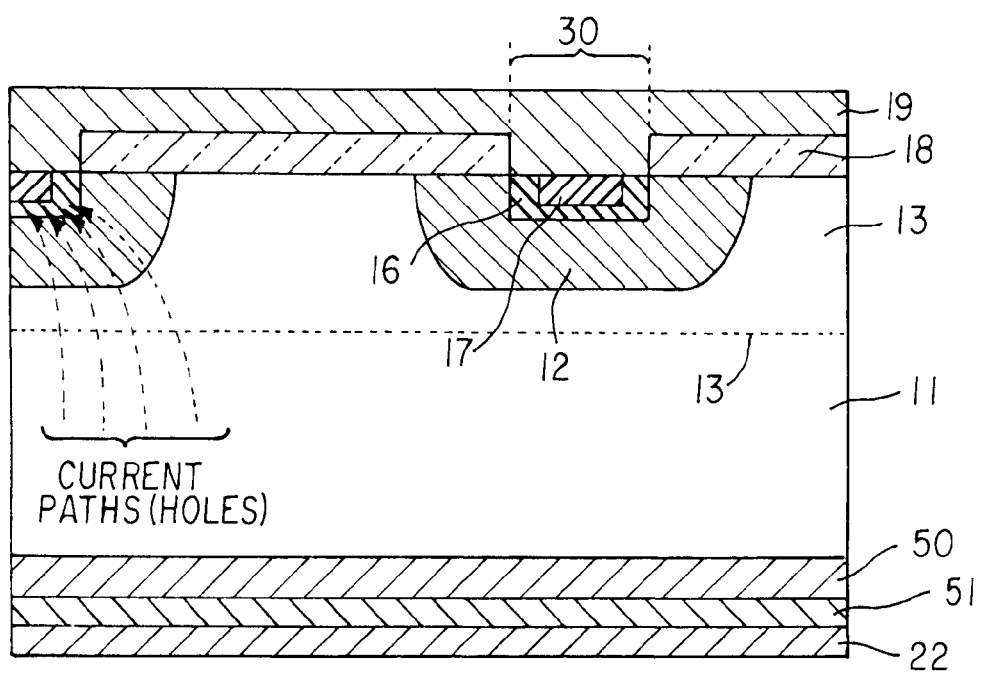
Figure 17:
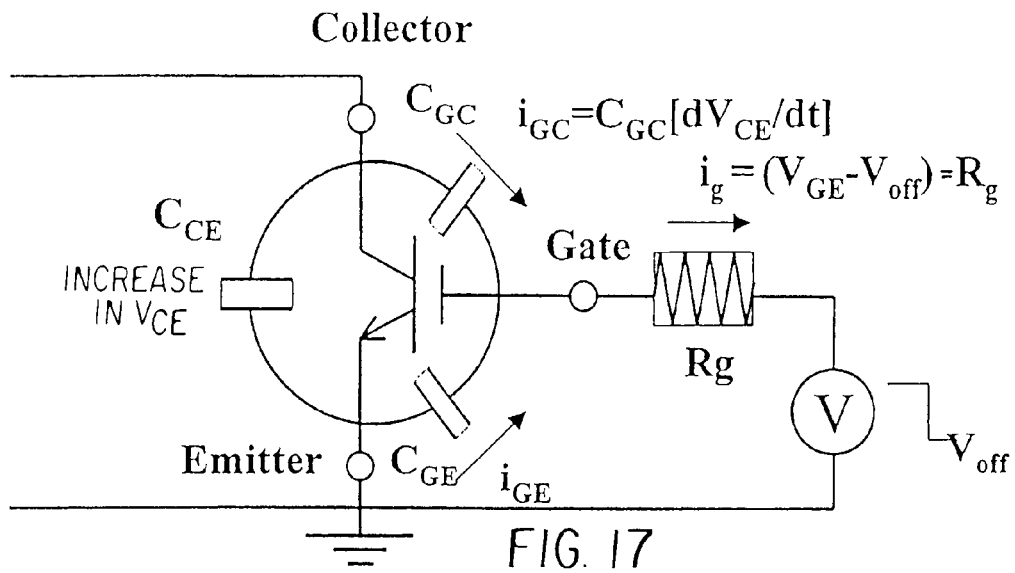
FIG. 17 is an equivalent circuit diagram showing a typical IGBT and its gate circuit.

The waveforms of the collector current, collector-emitter voltage and gate-emitter voltage at turning-off of the vertical trench gate MOS power device according to example 1 of the invention having the planar pattern shown in FIG. 12 when the current density of the device is 333 A/cm$^2$ are shown in FIG. 18. Moreover, the waveforms of those of the IGBTs with the related structure shown in FIG. 14 (example 1 of related device) are also shown in FIG. 18. A series of signs such as 4.0E-06 on the horizontal axis in FIG. 18 represents that it is $4.0 \times 10^{-6}$ with numerals after the sign E representing the power of 10. The same is true for other similar signs.

As is apparent from FIG. 18, the jumping voltage is suppressed to be 200V or less in the IGBT according to example 1 of the invention in contrast with the jumping voltages in the IGBTs with related structures which are 300V (in the structure of example 1 of related device) and 450V (in the structure of example 2 of related device). For adjusting a jumping voltage, the way of varying gate resistance is generally taken.

However, there is a tradeoff in which a turn-off loss increases when gate resistance is increased. The results of the study on correlation between a peak jumping voltage and a turn-off loss when switching speed is varied by varying gate resistance are shown in FIG. 19 which is a diagram showing a comparison of a relation between the peak jumping voltage and the turn-off loss at the turning-off of the IGBT according to example 1 of the invention with those of examples 1 and 2 of related IGBTs. It is known that also in the case in which gate resistance is made varied, the device according to example 1 of the invention shows characteristics equivalent to or more excellent than those of the examples 1 and 2 of the related devices.

In addition, according to FIG. 20, a diagram showing a comparison of the I-V characteristic of the IGBT according to example 1 of the invention with those of examples 1 and 2 of related IGBTs, the I-V characteristic of the IGBT according to example 1 of the invention enables the realization of an on-voltage approximately equal to or lower than those of the examples 1 and 2 of the related devices.

With the vertical and trench type insulated gate MOS semiconductor device according to example 1 of the invention as explained in the foregoing, the parallel realization of a large current density, a low on-voltage and suppression of jumping voltage at turning-off becomes possible. Moreover, this is performed by a very facilitated procedure without increasing process steps.

Next, detailed explanations will be made about the trench type insulated gate bipolar transistors (IGBTS) according to examples 2, 3 and 4 with reference to the drawings. In the following explanations, the term simply described as "a concentration (or density)" represents "an impurity concentration (or density)".

Figure 23:
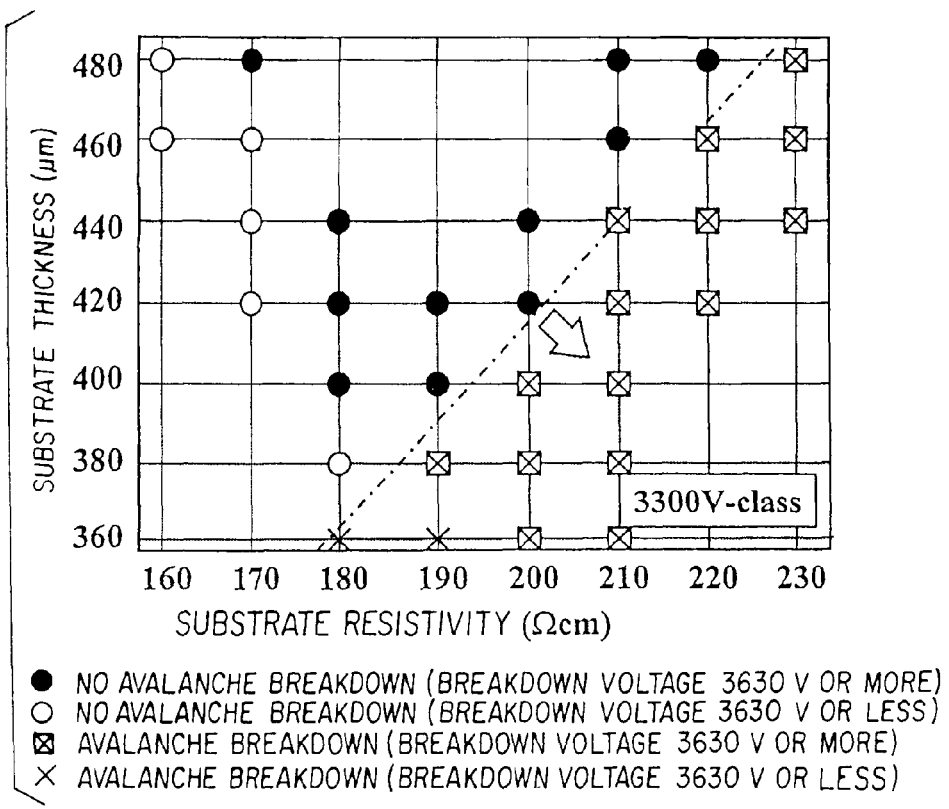
FIG. 23 is a diagram showing presence or absence of breakdown of a 3300V class IGBT rushing to avalanche breakdown in a relation between substrate resistivity and substrate thickness.
Figure 24:
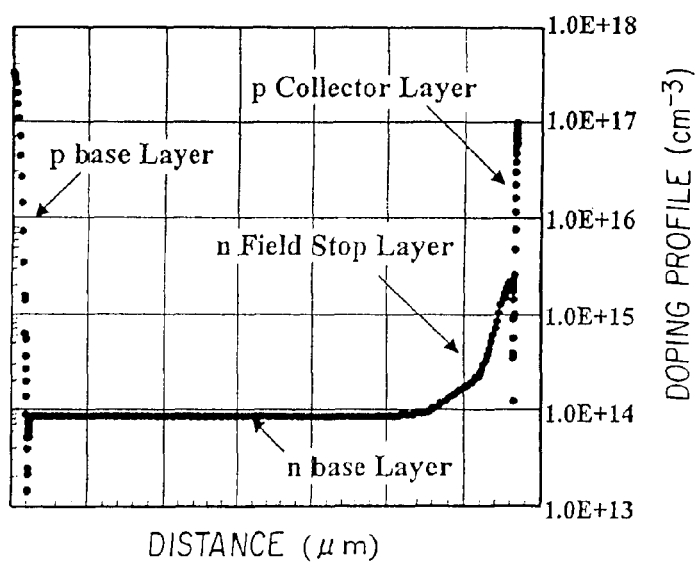
FIG. 24 is a diagram showing impurity concentration (density) distributions in various layers in the semiconductor substrate of an IGBT used for examining presence or absence of breakdown at rush to avalanche with the distance in the thickness direction from the surface of the semiconductor substrate taken on the horizontal axis.
Figure 25:
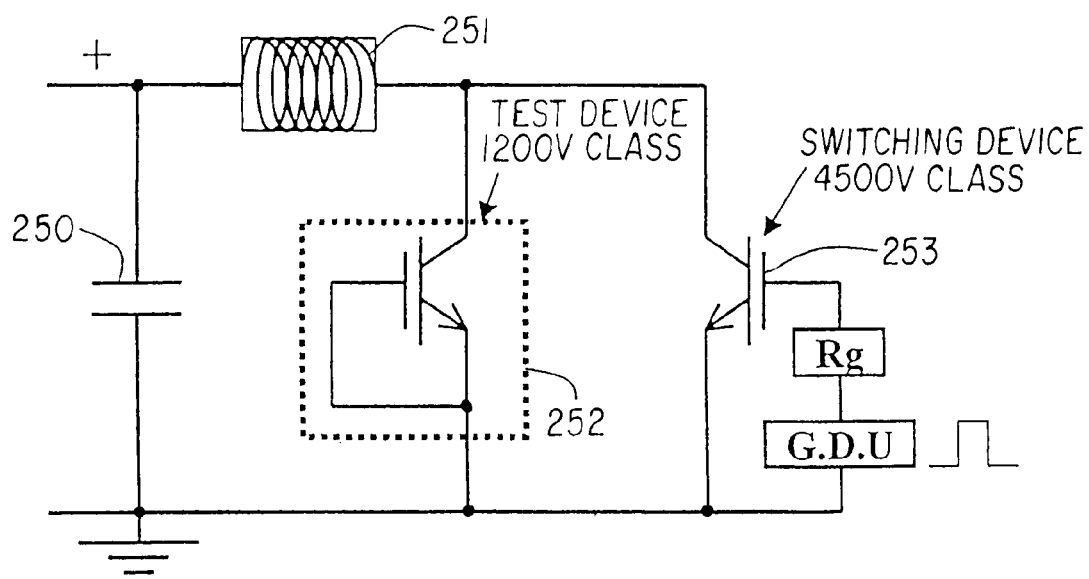
FIG. 25 is a circuit diagram showing a measuring system for examining presence or absence of breakdown of an IGBT rushing to avalanche breakdown in a relation between substrate resistivity and substrate thickness by breakdown voltage class of the IGBT.
Figure 27A:
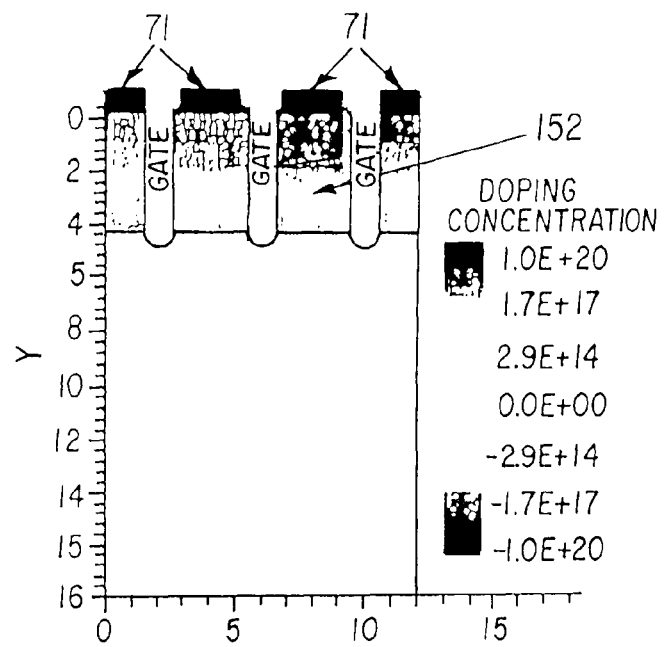
FIG. 27A is a cross sectional view showing a doping concentration distribution in the device in the condition shown in FIG. 26A.
Figure 27B:
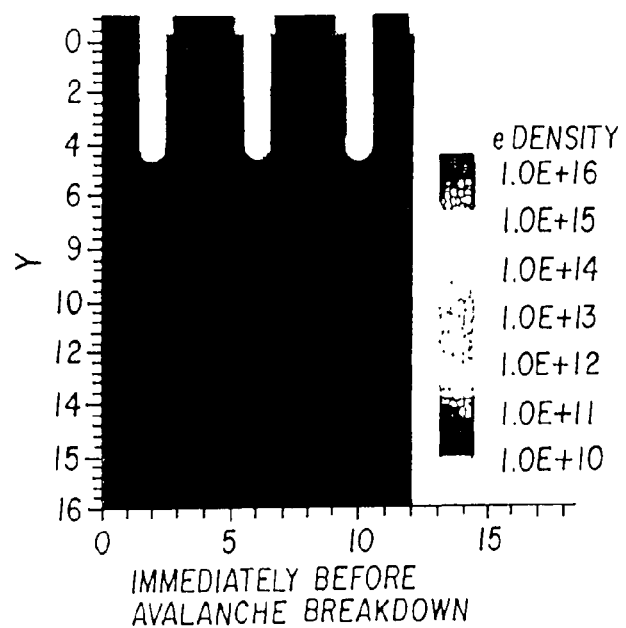
FIG. 27B is a cross sectional view showing an internal electron concentration (density) distribution immediately before the device in the condition shown in FIG. 26A rushes to the avalanche breakdown condition.
Figure 27C:
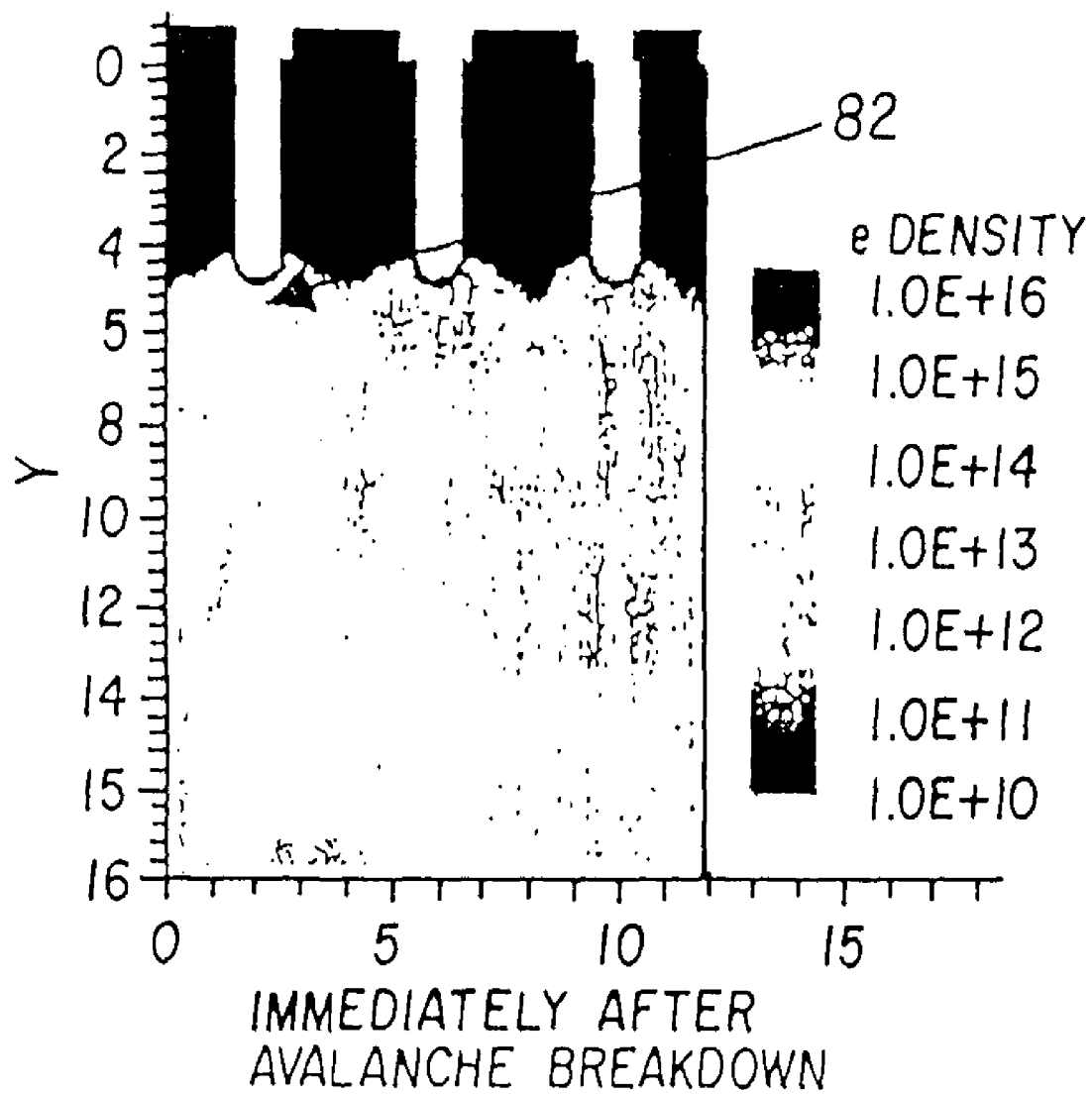
FIG. 27C is a cross sectional view showing an internal electron concentration (density) distribution immediately after the device in the condition shown in FIG. 26A rushes to the avalanche breakdown condition.
Figure 28A:
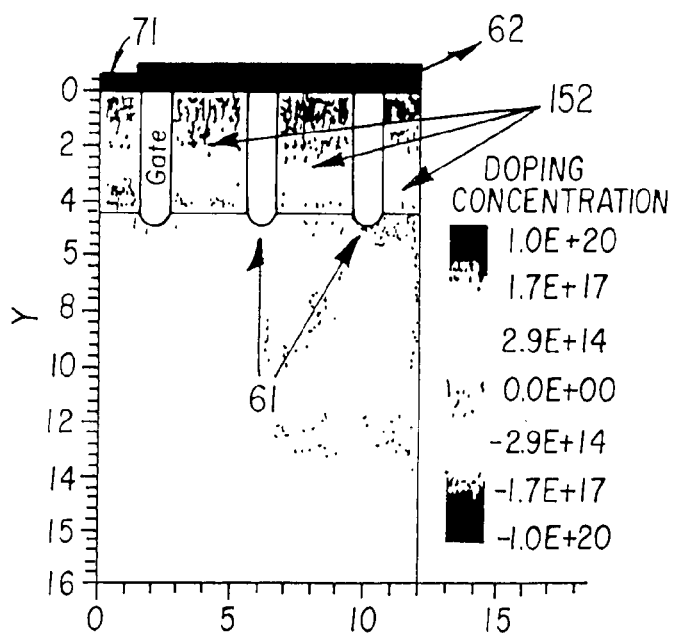
FIG. 28A is a cross sectional view showing a doping concentration distribution in the device in the condition shown in FIG. 26B.
Figure 28B:
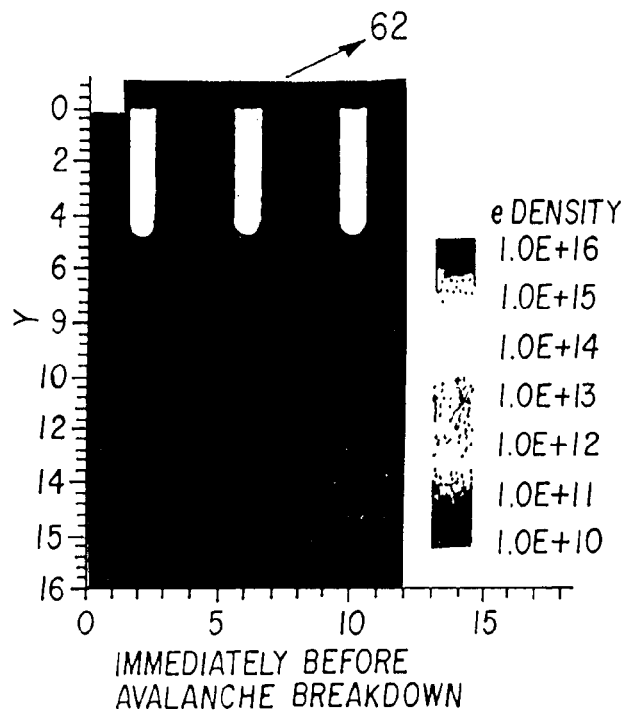
FIG. 28B is a cross sectional view showing an internal electron concentration (density) distribution immediately before the device in the condition shown in FIG. 26B rushes to the avalanche breakdown condition.
Figure 28C:
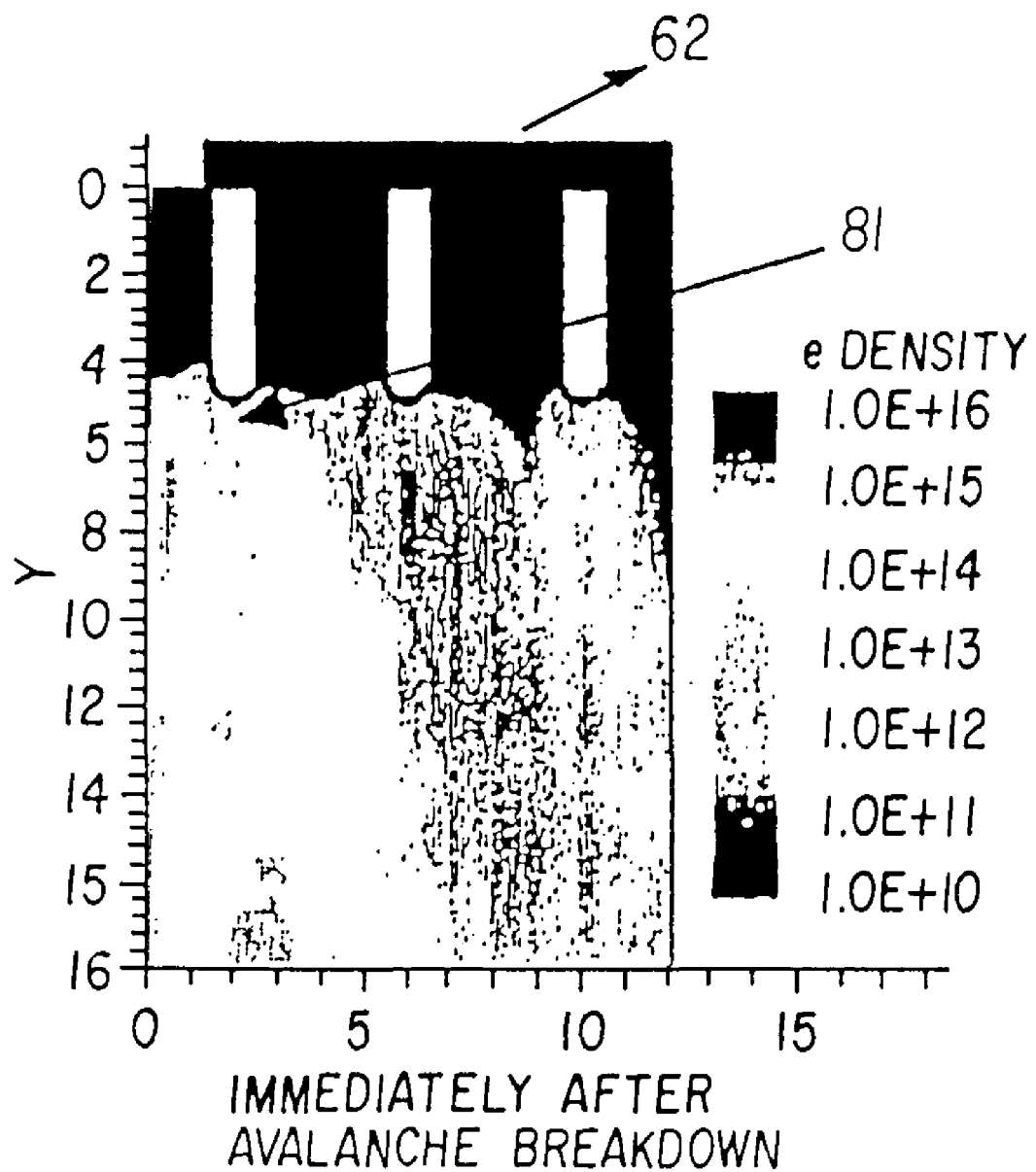
FIG. 28C is a cross sectional view showing an internal electron concentration (density) distribution immediately after the device in the condition shown in FIG. 26B rushes to the avalanche breakdown condition.
Figure 29A:
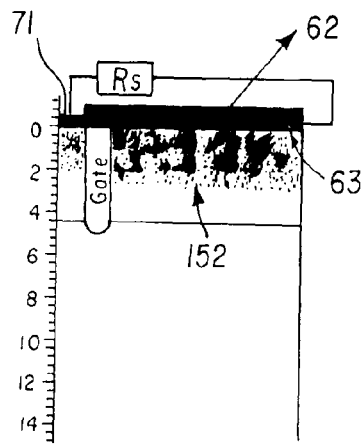
FIG. 29A is a cross sectional view showing the principal part of an IGBT according to the invention.
Figure 29B:
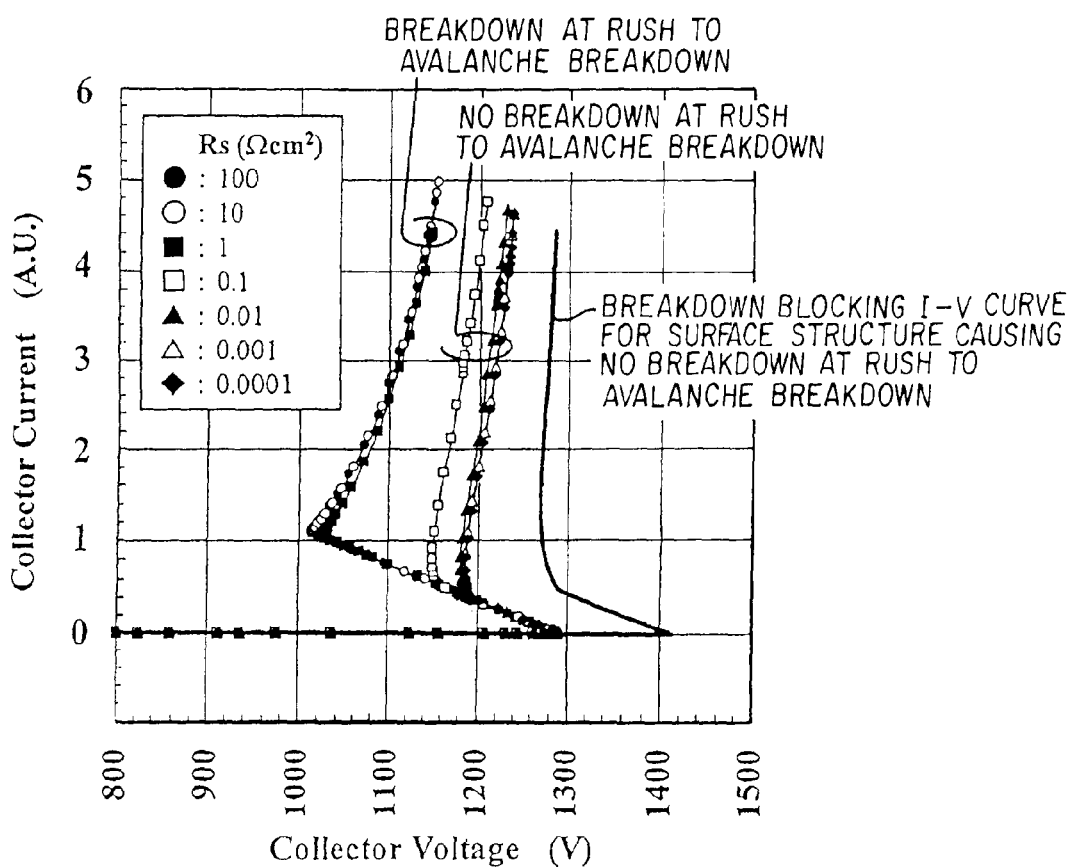
FIG. 29B is a diagram showing collector currents to the collector voltage at avalanche breakdown of the IGBT shown in FIG. 29A.
Figure 31A:
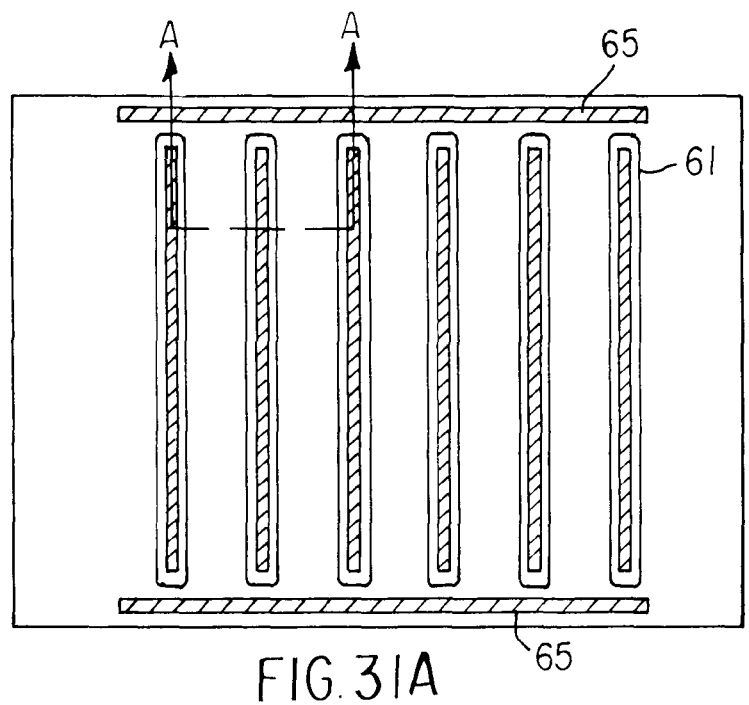
FIG. 31A is a plan view showing the principal part of an IGBT according to example 4 of the invention.
Figure 31B:
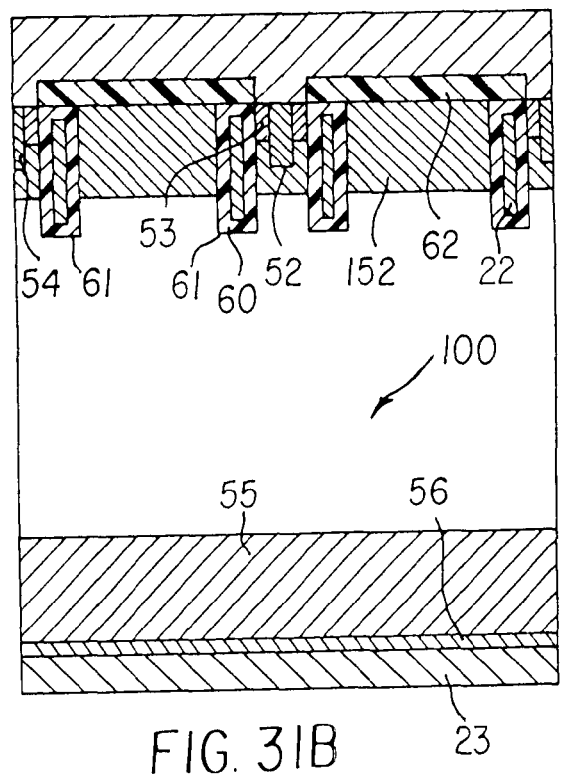
FIG. 31B is a cross sectional view taken on line A-A of FIG. 31A.
Figure 32A:
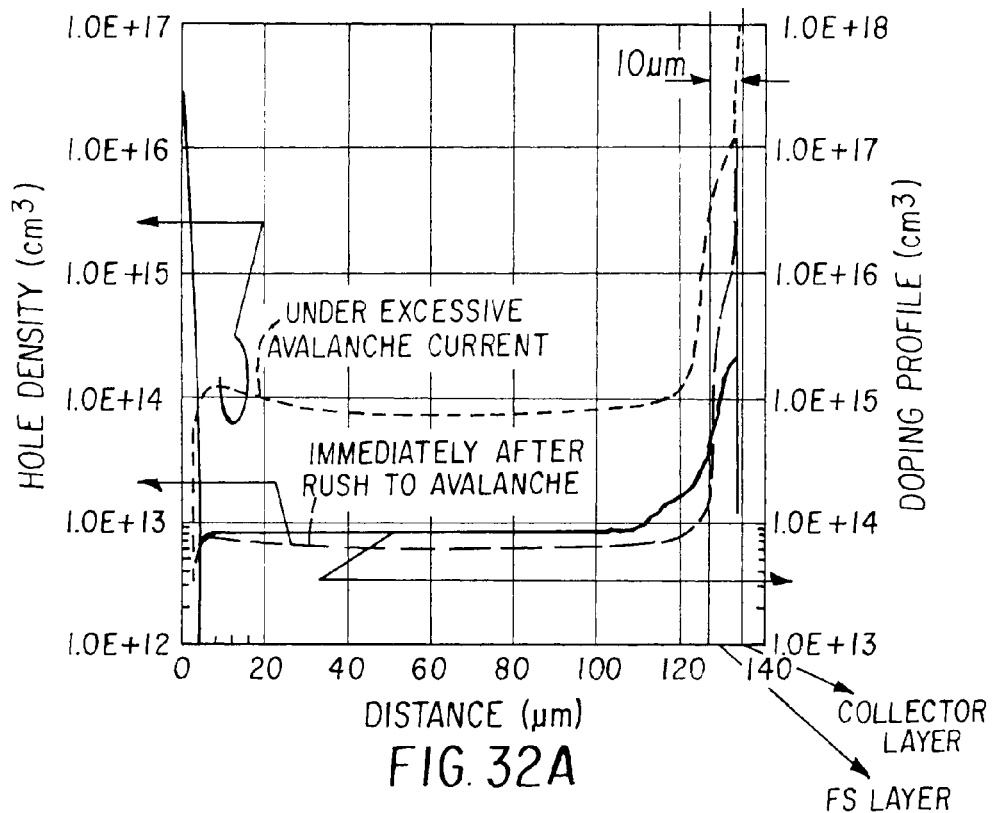
FIG. 32A is a diagram showing hole concentration (density) distributions when the IGBT according to the invention rushes to avalanche breakdown together with a doping profile.
Figure 32B:
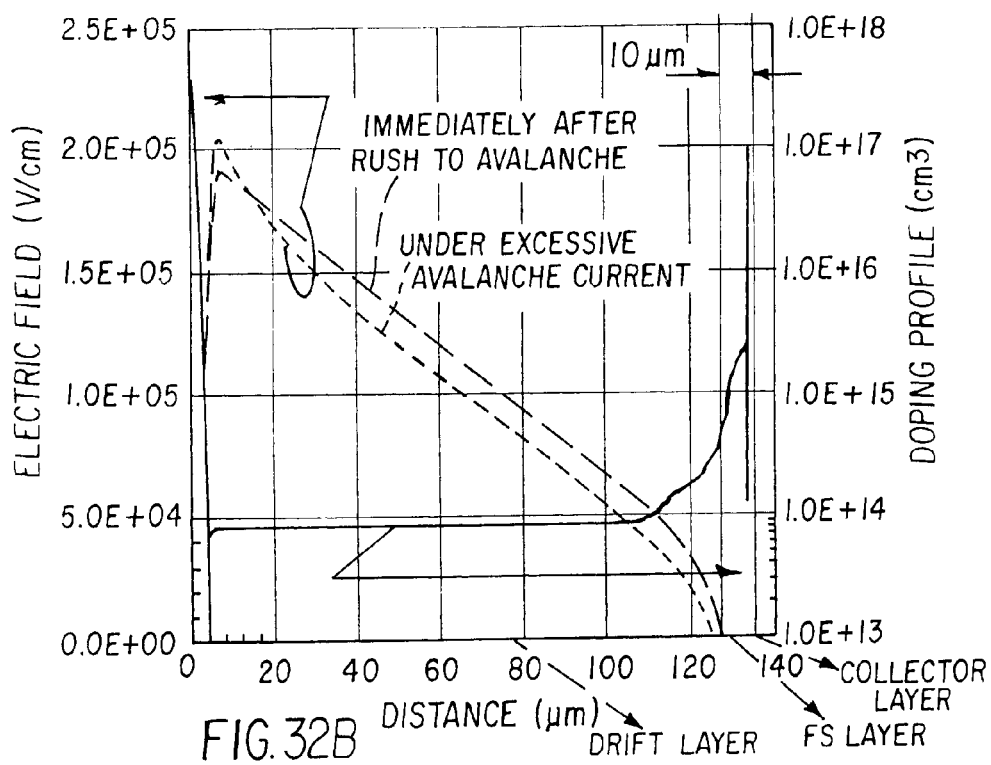
FIG. 32B is a diagram showing electric field strength distributions when the IGBT according to the invention rushes to avalanche breakdown together with a doping profile.

FIGS. 21 to 23 are diagrams showing presence or absence of breakdown of an IGBT rushing to avalanche breakdown in a relation between substrate resistivity and substrate thickness by breakdown voltage class of the IGBT. FIG. 24 is a diagram showing impurity concentration (density) distributions in various layers in the semiconductor substrate of an IGBT used for examining presence or absence of breakdown at rush to avalanche with the distance in the thickness direction from the surface of the semiconductor substrate taken on the horizontal axis. FIG. 25 is a circuit diagram showing a measuring system for examining presence or absence of breakdown of an IGBT rushing to avalanche breakdown in a relation between substrate resistivity and substrate thickness by breakdown voltage class of the IGBT. FIG. 26A is a diagram showing waveforms of the collector-emitter voltage $V_{CE}$ and collector current $I_C$ of a 1200V class device obtained by using the measuring system shown in FIG. 25 when the device rushed to an avalanche breakdown condition without causing breakdown. FIG. 26B is a diagram showing waveforms of the collector-emitter voltage $V_{CE}$ and collector current $I_C$ of a 1200V class device whose surface structure is different from that of the device shown in FIG. 26A, the waveforms being obtained by using the measuring system shown in FIG. 25 when the device rushed to an avalanche breakdown condition with breakdown. FIGS. 27A to 27C are cross sectional views showing a doping concentration distribution in the device in the condition shown in FIG. 26A, an internal electron concentration (density) distribution immediately before the device in the condition shown in FIG. 26A rushes to the avalanche breakdown condition and an internal electron concentration (density) distribution immediately after the device in the condition shown in FIG. 26A rushes to the avalanche breakdown condition, respectively. FIGS. 28A to 28C are cross sectional views showing a doping concentration distribution in the device in the condition shown in FIG. 26B, an internal electron concentration (density) distribution immediately before the device in the condition shown in FIG. 26B rushes to the avalanche breakdown condition and an internal electron concentration (density) distribution immediately after the device in the condition shown in FIG. 26B rushes to the avalanche breakdown condition, respectively. FIG. 29A is a cross sectional view showing the principal part of an IGBT according to the invention and FIG. 29B is a diagram showing collector currents to the collector voltage at avalanche breakdown of the IGBT shown in FIG. 29A. FIG. 30A is a plan view showing the principal part of an IGBT according to example 2 of the invention, and FIGS. 30B and 30C are cross sectional views taken on line A-A and line B-B, respectively, of FIG. 30A. FIG. 31A is a plan view showing the principal part of an IGBT according to example 4 of the invention, and FIG. 31B is a cross sectional view taken on line A-A of FIG. 31A. FIG. 32A is a diagram showing hole concentration (density) distributions when the IGBT according to the invention rushes to avalanche breakdown together with a doping profile. FIG. 32B is a diagram showing electric field strength distributions when the IGBT according to the invention rushes to avalanche breakdown together with a doping profile.

An IGBT having a structure in which a structure with a drift layer thinned by providing a field stop layer (hereinafter abbreviated as an FS layer) and a trench gate structure are combined has a problem of being liable to be broken down at avalanche breakdown. The study about the cause of the problem revealed that an IGBT having a trench gate structure exhibits negative resistance when rushing to avalanche breakdown and the negative resistance causes a phenomenon of making the IGBT breakdown when a current of the order of several amperes flows for a short time. The cause of the phenomenon can be considered as follows. Namely, electron-hole pairs produced by avalanche breakdown cause a parasitic transistor in the IGBT to operate to strongly cause local avalanche breakdown particularly in a high electric field strength region around a trench by carriers injected from the p-type collector layer. Furthermore, a parasitic thyristor of the IGBT is operated with a non-uniform operation of the device perhaps becoming a part of the cause of the operation of the parasitic thyristor to thereby make the IGBT breakdown. Therefore, it can be considered that there is a possibility of avoiding the breakdown by effectively reducing a current due to negative resistance exhibited when the device rushes to avalanche breakdown in the high electric field strength region. On the basis of the consideration, examples 2 and 3 according to the invention were made, which will be explained below.

A study about a current at breakdown revealed that an increase in current can be classified into following two causes. Namely, the causes are:

1) An increase in current at a rush to avalanche breakdown due to the specification of a semiconductor substrate and to a field stop layer (FS layer), and 2) An increase in current at a rush to avalanche breakdown due to the surface structure of an IGBT.

For explaining about the breakdown by the increase in current due to the above cause 1), namely, the increase in current at a rush to avalanche breakdown due to the specification of a semiconductor substrate and to the n-type FS layer, the avalanche breakdown was examined in the relation between the substrate resistivity and the substrate thickness for three kinds of IGBTs of 600V class, 1200V class and 3300V class with the results shown in FIG. 21, FIG. 22 and FIG. 23, respectively. The rough impurity doping profiles in the n-type FS layer, p-type collector layer and the p-type base layer common to the IGBTs of the three kinds of breakdown voltage classes are shown in FIG. 24. In the diagram, a sign such as 1.0E+13 on the vertical axis represents that it is $1.0 \times 10^{13}$ with numerals after the sign E representing the power of 10 (the same is true for similar signs in other diagrams). In particular, the n-type FS layer was carefully formed so that the peak concentration (density) therein becomes $1 \times 10^{16}$ cm$^{-3}$, from which mobility of carriers comes to decrease, or less and the diffusion depth therein becomes 10 μm or more. The reason will be explained later.

The circuit of the measuring system that examined the IGBTs of the three kinds of breakdown voltage classes is shown in FIG. 25. In the system, an IGBT device to be examined 252 in a turned-off state is connected in parallel to a high breakdown voltage device 253 for switching, to which a power supply 250 and an inductance 251 are connected in series. The turning-on and -off of the high breakdown voltage device 253 for switching generates a jumping voltage when the device 253 for switching is made turned-off to make it possible to apply a voltage exceeding the breakdown voltage of the IGBT device to be examined 252. At this time, by varying the inductance 251, it becomes possible to vary the current at a rush to avalanche.

From FIG. 21 to FIG. 23, showing the results of measurements by the circuit shown in FIG. 25, it is known that the IGBTs of any breakdown voltage classes become in common more liable to be broken down at a rush to avalanche breakdown as the resistivity of their substrates become higher and the thicknesses of their substrates become thinner. It is known from FIG. 21 to FIG. 23 that the regions in each of which no avalanche breakdown is caused are presented with ρ and tn⁻ made to represent the resistivity and the thickness, respectively, of the IGBT as: within a range approximately tn⁻>5ρ−90 in the 600V class device; within a range approximately tn⁻>4ρ−110 in the 1200V class device; and within a range approximately tn⁻>3ρ−180 in the 3300V class device, and thus, an IGBT, fabricated with the substrate resistivity ρ and the substrate thickness tn⁻ selected to satisfy the condition of the range, can avoid the breakdown at a rush to avalanche breakdown. In other words, with the breakdown voltage class, the concentration (density) in the substrate and the substrate thickness represented as Vmax(V), $N_D$(cm$^{-3}$) and tn⁻(μm), respectively, the concentration (density) in the substrate $N_D$ and the substrate thickness tn⁻ can be selected within a range expressed as $$N_D \times (tn^- + 0.033V\text{max} + 70) > 1.54 \times 10^{18} V\text{max}^{-0.299}.$$

Here, the correlation between the resistivity and the concentration (density) in the substrate is converted by applying the relation $$\rho \times N_D = 4.59 \times 10^{16} \text{ cm}^{-3}.$$

Here, an explanation will be made in the following about the reason why the previous explanation presented that the n-type FS layer was carefully formed so that the concentration (density) therein was made to be $1 \times 10^{16}$ cm$^{-3}$ or less and, along with this, the diffusion depth therein became 10 μm or more.

FIGS. 32A and 32B are diagrams showing the results of device simulation of hole concentration (density) distributions and electric field strength distributions, respectively, together with a doping profile in the direction of the thickness of the semiconductor substrate immediately after the occurrence of avalanche breakdown and when negative resistance is exhibited in a 1200V class IGBT according to the invention.

In FIG. 32A, it is known that minority carriers (holes) are injected over the thickness of approximately 10 μm from the p-type collector layer immediately after the occurrence of avalanche breakdown. However, the n-type FS layer formed with the diffusion depth of 10 μm or more makes the electric field strength of the device according to the invention zero in a section shallower than the depth (10 μm) to which minority carriers (holes) are injected as shown in FIG. 32B, a diagram showing the electric field strength distribution. This makes it known that the breakdown voltage of 1200V can be made held in this IGBT.

When the diffusion depth of the n-type FS layer is 10 μm or less, the function of inhibiting the extension of a depletion layer by the n-type FS layer becomes insufficient to result in substantial reach through states of the p base region and the p-type collector layer, by which the breakdown voltage of the device is largely reduced. This causes the device to exhibit large negative resistance and, accompanied with this, an over current flows to bring about avalanche breakdown.

Next, an explanation will be made about the cause 2), the breakdown caused by an increase in current at a rush to avalanche breakdown occurred due to the surface structure of an IGBT. The results of the study, carried out on the 1200V class IGBT about the breakdown at a rush to avalanche breakdown, are shown in FIGS. 26A and 26B. FIG. 26A shows the result of the measurement about the 1200V class IGBT having a surface structure in which almost the whole of the surface of a p base region 152 separated by dummy trenches 61 is in contact with an emitter electrode 71. Further in detail, FIG. 26A is a waveform diagram showing the waveforms of the collector-emitter voltage $V_{CE}$ and the collector current $I_C$ when the substrate resistivity and the substrate thickness of the IGBT were selected as 55 Ωcm and 130 μm, respectively. In the results shown in FIG. 26A, no breakdown at a rush to avalanche breakdown is observed (this is because the substrate resistivity and the substrate thickness are selected as being within such a range as to cause no breakdown, which range is shown in FIG. 22).

Compared with this, FIG. 26B shows the result of the measurement about the 1200V class IGBT having a surface structure of a type which increases the hole concentration (density) near the device surface in an n base layer (drift layer) 51 by separately providing a floating p region 152 partially in the p base region 52. The floating p region 152 is separated from the emitter electrode 71 by an insulator film 62 and, along with this, is separated from a trench gate structure 80 by dummy trenches 61. Further in detail, FIG. 26B is a waveform diagram showing the waveforms of the collector-emitter voltage $V_{CE}$ and the collector current $I_C$ when the substrate resistivity and the substrate thickness of the IGBT were selected as 55 Ωcm and 130 μm, respectively. In the results shown in FIG. 26B, a phenomenon is observed in which the IGBT is degraded in a breakdown voltage to breakage at a rush to avalanche breakdown.

The IGBTs as test devices, the waveforms of the collector-emitter voltage $V_{CE}$ and collector current $I_C$ of which are shown in FIGS. 26A and 26B, have substrate thicknesses and substrate resistivity values common to both as 55 Ωcm and 130 μm, respectively, with only difference between them being in their surface structures. Therefore, the breakage at avalanche breakdown is considered to be attributed to the surface structure of the device used in the test with the results thereof shown in FIG. 26B.

FIGS. 27A, 27B and 27C are cross sectional views showing the results of analyses by device simulations about a doping concentration distribution, an electron concentration (density) distribution immediately before avalanche breakdown and an electron concentration (density) distribution immediately after the avalanche breakdown, respectively, in the IGBT having the surface structure shown in FIG. 26A. FIGS. 28A, 28B and 28C are cross sectional views showing the results of analyses by device simulations about a doping concentration distribution, an electron concentration (density) distribution immediately before avalanche breakdown and an electron concentration (density) distribution immediately after the avalanche breakdown, respectively, in the IGBT having the surface structure shown in FIG. 26B. Namely, the surface structure of the IGBT shown in FIGS. 27A, 27B and 27C is a simulation of the surface structure of the type in which, similarly to the surface structure shown in FIG. 26A, almost the whole of the surface of the p base region 52 separated by trenches is in contact with the emitter electrode 71. While, the surface structure of the IGBT shown in FIGS. 28A, 28B and 28C is a simulation of the surface structure of the type in which, similarly to the surface structure shown in FIG. 26B, the floating p region 152 is provided which is separated by the trench 61 and, along with this, insulated from the emitter electrode 71.

As is known from the comparison between the conditions shown in FIGS. 27A, 27B and 27C and those shown in FIGS. 28A, 28B and 28C, in the IGBT shown in FIG. 28A to 28C, having the floating p region 152 separated by the trenches 61 and, along with this, insulated from the emitter electrode 71, carriers (electrons) produced at rush to avalanche breakdown distribute less uniformly with a larger amount as shown at a position denoted by reference numeral 81 than carriers at a position denoted by reference numeral 82 in the IGBT shown in FIG. 27C. In addition, in the IGBT shown in FIGS. 28A to 28C, a current path is also restricted to the region in contact with the emitter electrode 71. Therefore, compared with the IGBT shown in FIG. 27A having a surface structure of the type in which almost the whole of the surface of the p base region 52 is in contact with the emitter electrode 71, the following can be said. Namely, the IGBT shown in FIGS. 28A to 28C is in a state in which a larger amount of current is produced at rush to avalanche, the current path is narrower and a current density is higher. Thus, the IGBT is liable to be broken at rush to avalanche breakdown. Therefore, for avoiding the breakage at the rush to avalanche breakdown, the current path in the device at the rush to avalanche breakdown must be made uniform like that in the device shown in FIGS. 27A to 27C. As a result, it is understood as being important that the device provides:

1) a structure in which current paths are provided in all of the regions between adjacent trenches 61; and
2) a structure in which the current paths are made as uniform as possible to reduce current concentration.

A study was carried out for making the IGBT, with a structure having the floating p region 152 provided so as to be insulated from the emitter electrode 71 with the insulator film 62 interposed between, improved to have a structure that causes no breakage at rush to avalanche breakdown as one of the IGBTs according to the invention. The results of the study are shown in FIGS. 29A and 29B and Table 1.

Namely, by providing a local opening 63 in the insulator film 62, there is provided such a structure that the floating p region 152 is conductively connected to the emitter electrode 71 through the opening 63 with intervention of lateral resistance of the floating p region 152 itself in terms of an equivalent circuit. This makes it possible to fix the electric potential difference across the floating p region 152 to be low. Therefore, there exists a maximum allowable value in the lateral component of the resistance.

Table 1 lists the results of the study made about the magnitude of the lateral resistance component (the value to the unit area in the active region of the device) to intervene between the floating p region 152 and the emitter electrode 71 and the state of breakage at rush to avalanche breakdown.

TABLE 1

| RESISTANCE VALUE PER UNIT AREA (Ω/cm²) | NUMBER OF BREAKAGES/ NUMBER OF SPECIMENS |
| --- | --- |
| 100 | 10/10 |
| 10 | 10/10 |
| 1 | 10/10 |
| 0.1 | 1/10 |
| 0.01 | 0/10 |
| 0.001 | 0/10 |
| 0.0001 | 0/10 |

It is known from Table 1 that, when small resistance of 100 mΩ/cm² or less, preferably 10 mΩ/cm² or less, per unit area of the active region of the device exists between the floating p region 152 and the emitter electrode 71, an IGBT, even though it has a floating p region 152 separated by the trenches 61 with the insulator film interposed between the emitter electrode 71, can be made to have a surface structure causing no breakage at rush to avalanche breakdown.

In FIGS. 30A, 30B and 30C, there are shown a plan view of the principal part of an IGBT according to example 2 of the invention, a cross sectional view taken on line A-A of FIG. 30A and a cross sectional view taken on line B-B of FIG. 30A, respectively. In FIGS. 31A and 31B, there are shown a plan view of the principal part of an IGBT according to example 4 of the invention and a cross sectional view taken on line A-A of FIG. 31A, respectively.

EXAMPLE 2

In FIG. 30A as a plan view showing a principal part of an IGBT according to example 2, a region surrounded by a trench 61 having a stripe-like planar pattern is the floating p region 152. As shown in FIG. 30C, a cross sectional view taken on line B-B of FIG. 30A, contact holes 63 are provided at fixed intervals in the insulator film 62 formed on the surface of the floating p region 152. Through the contact holes 63, the emitter electrode 71 is conductively connected to the floating p region 152. As shown in FIG. 30A and FIG. 30B, a cross sectional view taken on line A-A of FIG. 30A, between adjacent trenches 61, each surrounding its own floating p region 152, the p base region 52 is formed, in the surface layer of which there are formed an emitter region 53 and a p$^+$-type body region 54 with a high concentration. In the insulator film 62 on the surface of the regions 52, 53 and 54, an emitter contact hole 64 are formed for making the regions 52, 53 and 54 contact with the emitter electrode 71.

A part of the main current from a collector electrode 73 also flows to the emitter electrode 71 through the contact holes 63 formed in the insulator film 62 at fixed intervals. At this time, the value of a voltage drop caused by the currents flowing in the floating p region 152 in the lateral direction (the direction in parallel to the principal plane of the substrate) toward the contact holes 63 corresponds to the value of the resistance (Rs($\Omega$)) existing between the contact holes 63 along the current paths in the floating p region 152. The value of the resistance (Rs($\Omega$)) can be obtained by multiplying the value of resistance per unit area ($\Omega/cm^2$), i.e. the value of sheet resistance, by the value of distance between the contact holes 63. Therefore, with the specification of the floating p region 152 being given constant, the magnitude of the resistance (Rs($\Omega$)) can be adjusted by adjusting the interval between the contact holes.

As shown in FIG. 30B as a cross sectional view taken on line A-A of FIG. 30A, on a bottom surface of a semiconductor substrate (drift layer) 100, a p-type collector layer 56 is provided with an n-type FS layer 55 having a thickness of 10 $\mu$m or more interposed between. Furthermore, on the surface of the p-type collector layer 56, the collector electrode 73 is formed. On the top principal plane side of the IGBT, the p base region 52 (a first region) and the floating p region 152 (a second region) are separated from each other by the trenches 61. On the surface of the floating p region 152, the insulator film 62 is provided for insulating the floating p region 152 from the emitter electrode 71.

While, from the surface of the p base region 52, the emitter region 53 and the p$^+$-type body region 54 with the high concentration are formed toward the inside. With the surfaces of the emitter region 53 and the p$^+$-type body region 54, the emitter electrode 71 is brought into common contact. Inside the trench 61, a gate electrode 72 is buried with a gate insulator film 60 interposed between. The surface of the gate electrode 72 is insulated from the emitter electrode 71 by the insulator film 62.

In FIG. 30C as a cross sectional view taken on line B-B of FIG. 30A, it is shown that the contact holes 63 are formed at fixed intervals in the insulator film 62 covering the surface of the floating p region 152, which is in contact with the emitter electrode 71 at the contact holes 63. A main current flowing from the collector electrode 73 toward the emitter electrode 71 passes through the contact holes 63 in the region corresponding to the section beneath the floating p region 152 for the emitter electrode 71. Therefore, as shown in FIG. 30C, current paths are formed in the direction of the principal plane directly beneath the insulator film 62 between the contact holes 63. Along the current paths, there exists resistance determined by the impurity concentration distribution in the floating p region 152 and the distance between the contact holes 63.

Thus, by determining the impurity concentration distribution in the floating p region 152 and the distance between the contact holes 63 so that the resistance is made to have a value less than 100 m$\Omega/cm^2$ per unit area in the active region of the device, desirably less than 10 m$\Omega/cm^2$, even with the structure in which an insulator film is provided to cover the floating p region 152, it becomes possible to avoid breakage of the IGBT at rush to avalanche breakdown.

In the IGBT shown in FIG. 31A as a plan view and FIG. 31B as a cross sectional view taken on line A-A of FIG. 31A, an emitter runner 65 is provided on the periphery of an active section in the vicinity of each end of the IGBT chip in the longitudinal direction of the trench 61. In the structure, by adjusting the concentration (density) (or the sheet resistance ($\Omega/cm^2$)) of the floating p region 152 and the distance between the emitter runners 65, each of the emitter runners 65 is made to have the function similar to that of the contact hole 63 on the floating p region 152.

In this way, even though an IGBT has a structure without contact holes 63 formed in the insulator film 62 on the floating p region 152, as far as the IGBT has a structure in which a current flows inside the floating p region 152 in the lateral direction to reach the emitter electrode like the IGBTs according to example 2 shown in FIGS. 30A to 30C, respectively, the hole density on the top surface side of the drift layer 51 directly beneath the floating p region 152 can be easily increased to make it possible to lower an on-voltage.

According to examples explained in the foregoing, in an IGBT having a structure, provided with an n-type FS layer whose impurity concentration (density) and thickness are controlled, and a life time longer than 1 $\mu$s, only by selecting an adequate semiconductor substrate resistivity and a substrate thickness, it becomes possible to avoid breakage at rush to avalanche breakdown.

Furthermore, as was explained in the foregoing, there is an IGBT provided with the following structure. The structure has a floating p region that is separated from the trench gate structure by the trenches and, along with this, is positioned in a layer beneath an emitter electrode with an insulator film interposed between. By providing such a structure, it is made possible for the IGBT to reduce on-resistance (on-voltage) with the hole concentration (density) on the top surface side made increased. Also in such an IGBT, the floating p region and the emitter electrode are preferably connected with intervention of resistance the value of which is a specified one or less. Namely, by connecting both with intervention of low resistance of 100 m$\Omega/cm^2$ or less, preferably 100 m$\Omega/cm^2$ or less, it becomes possible to avoid breakage at rush to avalanche breakdown.

While the present invention has been particularly shown and described with reference to preferred embodiments thereof, it will be understood by those skilled in the art that the foregoing and other changes in form and details can be made therein without departing from the spirit and scope of the present invention.

What is claimed is:

1. A vertical and trench type insulated gate MOS semiconductor device comprising:
   a semiconductor substrate of a first conductivity type;
   a base region of a second conductivity type selectively formed on one of the principal surfaces of the semiconductor substrate of the first conductivity type;
   an emitter region of the first conductivity type selectivity formed on the surface of the base region of the second conductivity type;
   a body region of the second conductivity type formed on the surface of the base region of the second conductivity type while being in contact with the emitter region of the first conductivity type, the body region having an impurity concentration higher than that of the base region;

a plurality of straight-line-like trenches arranged in parallel to form a surface pattern of a plurality of parallel straight lines, each trench being formed from the surface of the emitter region of the first conductivity type to a depth reaching the semiconductor substrate of the first conductivity type while penetrating the base region of the second conductivity type;

a gate electrode buried in each of the trenches with a gate insulator film interposed between; and an emitter electrode making common conductive contact with both of the surfaces of the emitter region of the first conductivity type and the body region of the second conductivity type;

wherein, in a plurality of regions on the surface of the semiconductor substrate each being provided between adjacent ones of a plurality of the straight-line-like trenches arranged in parallel and forming a surface pattern of a plurality of the straight lines, there are included:

a plurality of first inter-trench surface regions in each of which the surfaces of (i) the base regions of the second conductivity type, each with the emitter region of the first conductivity type and the body region of the second conductivity type formed thereon, are alternately arranged with (ii) the surfaces of regions of the semiconductor substrate of the first conductivity type along the trench in the longitudinal direction thereof, with the emitter electrode being in common contact with both of the surfaces of the emitter region of the first conductivity type and the body region of the second conductivity type; and a plurality of second inter-trench surface regions each of which is formed along the trench in the longitudinal direction thereof comprising the surface of the base region of the second conductivity type.

2. The vertical and trench type insulated gate MOS semiconductor device as claimed in claim 1 wherein the surface of the base region of the second conductivity type formed in the second inter-trench surface region is conductively connected to the emitter electrode with intervention of resistance in terms of an equivalent circuit.

3. The vertical and trench type insulated gate MOS semiconductor device as claimed in claim 2 wherein the resistance intervening between the base region of the second conductivity type and the emitter electrode is less than 100 m$\Omega$/cm$^2$.

4. The vertical and trench type insulated gate MOS semiconductor device as claimed in claim 1 wherein the first inter-trench surface regions and the second inter-trench surface regions are alternately disposed with each of the trenches interposed between.

5. The vertical and trench type insulated gate MOS semiconductor device as claimed in claim 1 wherein the first inter-trench surface regions and the second inter-trench surface regions are arranged at fixed intervals in the transverse direction of the trench.

6. The vertical and trench type insulated gate MOS semiconductor device as claimed in claim 5 wherein the fixed interval in the transverse direction of the trench is 5 µm or less.

7. The vertical and trench type insulated gate MOS semiconductor device as claimed in claim 6 wherein, in the longitudinal direction of the trench of the first inter-trench surface region, to a repetition pitch for arranging a region including one surface of the base region of the second conductivity type with the emitter region of the first conductivity type formed thereon and one surface of the region with a portion of the semiconductor substrate of the first conductivity type, the proportion of the length of the surface of the emitter region in the surface of the base region of the second conductivity type, with which length the emitter region is in contact with the trench, is one half or more.

8. The vertical and trench type insulated gate MOS semiconductor device as claimed in claim 7 wherein the total of the lengths with which the emitter regions of the first conductivity type are in contact with the trench is 30% or more of the total of the longitudinal lengths of the trenches.

9. The vertical and trench type insulated gate MOS semiconductor device as claimed in claim 1, wherein the first inter-trench surface region comprises surfaces of the base regions of the second conductivity type, the emitter region of the first conductivity type, the body region of the second conductivity type and the semiconductor substrate of the first conductivity type.

10. The vertical and trench type insulated gate MOS semiconductor device as claimed in claim 1, wherein the plurality of second inter-trench surface regions additionally comprises surface portions of the semiconductor substrate of the first conductivity type.

11. A trench gate type insulated gate bipolar transistor comprising:

a semiconductor substrate of a first conductivity type to be a drift layer;

a base region of a second conductivity type selectively formed on one of the principal surfaces of the semiconductor substrate of the first conductivity type;

an emitter region of the first conductivity type selectivity formed on the surface of the base region of the second conductivity type;

a plurality of straight-line-like trenches arranged in parallel to form a planar pattern of a plurality of parallel straight lines, each trench being formed from the surface of the emitter region of the first conductivity type to reach the semiconductor substrate of the first conductivity type while penetrating the base region of the second conductivity type;

a gate electrode formed in each of the trenches with a gate insulator film interposed between;

an emitter electrode making contact with both of the surfaces of the base region of the second conductive type and the emitter region of the first conductivity type;

a collector layer of the second conductivity type formed on the other principal surface of the semiconductor substrate of the first conductivity type;

a collector electrode in contact with the collector layer; and a field stop layer of the first conductivity type provided between the drift layer as the semiconductor substrate of the first conductivity type and the collector layer of the second conductivity type, the field stop layer having an impurity concentration higher than that of the drift layer and formed with a diffusion depth from the other principal surface being 10µm or more;

wherein the transistor is provided with a structure in which the base region of the second conductivity type is divided into a first region and a second region by a plurality of the trenches, the surface of the base region in the first region directly contacts the emitter electrode, and the surface of the base region in the second region contacts the emitter electrode with an insulator film interposed between to allow a part of a current to flow to the emitter electrode through the second region formed so as to have resistance of less than 100 m$\Omega$/cm$^2$ per unit area.

12. The trench gate type insulated gate bipolar transistor as claimed in claim 11 wherein the structure of allowing a part of a current to flow to the emitter electrode through the second region is a structure in which the emitter electrode is connected to the surface of the second region through openings selectively provided in the insulator film on the surface of the second region.

13. The trench gate type insulated gate bipolar transistor as claimed in claim 11 wherein the structure of allowing a part of a current to flow to the emitter electrode through the second region is a structure in which the emitter electrode is connected to an emitter runner placed on the outside of the longitudinal end of each of the first region and the second region.

14. The trench gate type insulated gate bipolar transistor as claimed in claim 12 wherein, when avalanche breakdown occurs in a turned-off state, a distance between the collector layer and an end of a space charge region is at least 10 μm or more, the space charge region expanding in the drift layer toward the collector layer from a p-n junction between the first region in the base region of the second conductivity type and the drift layer.

15. A trench gate type insulated gate bipolar transistor comprising:
a semiconductor substrate of a first conductivity type to be a drift layer;
a base region of a second conductivity type selectively formed on one of the principal surfaces of the semiconductor substrate of the first conductivity type;
an emitter region of the first conductivity type selectivity formed on the surface of the base region of the second conductivity type;
a plurality of straight-line-like trenches arranged in parallel to form a planar pattern of a plurality of parallel straight lines, each trench being formed from the surface of the emitter region of the first conductivity type to reach the semiconductor substrate of the first conductivity type while penetrating the base region of the second conductivity type;
a gate electrode formed in each of the trenches with a gate insulator film interposed between;
an emitter electrode making contact with both of the surfaces of the base region of the second conductive type and the emitter region of the first conductivity type;
a collector layer of the second conductivity type formed on the other principal surface of the semiconductor substrate of the first conductivity type;
a collector electrode in contact with the collector layer; and
a field stop layer of the first conductivity type provided between the drift layer as the semiconductor substrate of the first conductivity type and the collector layer of the second conductivity type, the field stop layer having an impurity concentration higher than that of the drift layer and formed with a diffusion depth from the other principal surface being 10 μm or more;
wherein the emitter electrode makes direct contact with the surface of each base region of the second conductivity positioned between the trenches adjacent to each other; and wherein, when avalanche breakdown occurs in a turned-off state, a distance between the collector layer and an end of a space charge region is at least 10 μm or more, the space charge region expanding toward the collector layer from a p-n junction formed between the base region of the second conductivity type and the drift layer.

16. The trench gate type insulated gate bipolar transistor as claimed in claim 15 wherein, the field stop layer has an impurity concentration lower than $1 \times 10^{16} \text{cm}^{-3}$.

17. The trench gate type insulated gate bipolar transistor as claimed in claim 16 wherein the field stop layer has an impurity concentration of $1 \times 10^{12} \text{cm}^{-3}$ or more in a non-space charge region thereof present between the collector layer and an end of a space charge region expanding in the drift layer toward the collector layer from a p-n junction formed between the base region of the second conductivity type and the drift layer when avalanche breakdown occurs in a turned-off state.

18. The trench gate type insulated gate bipolar transistor as claimed in claim 17 wherein the life time of carriers in the drift layer is longer than 1 μs.

19. The trench gate type insulated gate bipolar transistor as claimed in claim 18 wherein, in a transistor with a breakdown voltage class of 600V class, the resistivity ($\rho(\Omega\text{cm})$) and the thickness ($tn^-(\mu m)$) of the semiconductor substrate of the first conductivity type have a relation presented by the following expression:

$$tn^- > 5 \times \rho - 90.$$

20. The trench gate type insulated gate bipolar transistor as claimed in claim 18 wherein, in a transistor with a breakdown voltage class of 1200V class, the resistivity ($\rho(\Omega\text{cm})$) and the thickness ($tn^-(\mu m)$) of the semiconductor substrate of the first conductivity type have a relation presented by the following expression:

$$tn^- > 4 \times \rho - 110.$$

21. The trench gate type insulated gate bipolar transistor as claimed in claim 18 wherein, in a transistor with a breakdown voltage class of 600V class, the resistivity ($\rho(\Omega\text{cm})$) and the thickness ($tn^-(\mu m)$) of the semiconductor substrate of the first conductivity type have a relation presented by the following expression:

$$tn^- > \times \rho - 180.$$

22. The trench gate type insulated gate bipolar transistor as claimed in claim 18, wherein, in a transistor with a breakdown voltage class of Vmax class, the resistivity ($\rho(\Omega\text{cm})$) and the thickness ($tn^-(\mu m)$) of the semiconductor substrate of the first conductivity type have a relation presented by the following expression:

$$N_D \times (tn + 0.033 V\text{max} + 70) > 1.54 \times 10^{18} \times V\text{max}^{-0.299} \quad (4)$$

wherein, the correlation between the resistivity and an impurity concentration (density) in the substrate of the first conductivity type $N_D$ has a relation $\rho \times N_D$ 4.59× $10^{16}$.

* * * * *